United States Patent
Kim et al.

(10) Patent No.: US 11,997,896 B2
(45) Date of Patent: May 28, 2024

(54) DISPLAY APPARATUS WITH INCREASED RELIABILITY

(71) Applicant: Samsung Display Co., Ltd., Yongin-si (KR)

(72) Inventors: Sunghwan Kim, Yongin-si (KR); Daehyun Kim, Yongin-si (KR); Eunju Kim, Yongin-si (KR); Hyunchol Bang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 291 days.

(21) Appl. No.: 17/450,539

(22) Filed: Oct. 11, 2021

(65) Prior Publication Data

US 2022/0285474 A1  Sep. 8, 2022

(30) Foreign Application Priority Data

Mar. 4, 2021  (KR) .......... 10-2021-0028965

(51) Int. Cl.
*G09G 3/32* (2016.01)
*H10K 59/121* (2023.01)
*H10K 59/131* (2023.01)

(52) U.S. Cl.
CPC ....... *H10K 59/131* (2023.02); *H10K 59/1213* (2023.02)

(58) Field of Classification Search
CPC ............. H10K 59/131; H10K 59/1213; H10K 59/1315; H10K 59/12; H10K 59/121; G09G 2300/0426; G09G 2300/043; G09G 2300/0819; G09G 2300/0842; G09G 2310/0251; G09G 3/3241; G09G 3/3233; G09G 3/3266; G09G 3/3275; G09G 3/32
See application file for complete search history.

(56) References Cited

U.S. PATENT DOCUMENTS 9,099,039 B2   8/2015  Kim
10,074,314 B2  9/2018  Lee et al.
11,100,839 B2 * 8/2021  Ono .................... G09G 3/2074
(Continued)

FOREIGN PATENT DOCUMENTS

KR  10-2016-0120376 A  10/2016
KR  10-2017-0000061 A   1/2017
(Continued)

*Primary Examiner* — Pegeman Karimi
(74) *Attorney, Agent, or Firm* — Lewis Roca Rothgerber Christie LLP

(57) ABSTRACT

The present disclosure relates to a display apparatus with a reduced resistance of wirings configured to transfer electric signals to pixels, the display apparatus including: a plurality of pixels arranged on a substrate; a first scan line arranged on the substrate and including a first extension portion and a plurality of first branches, the first extension portion extending in a first direction in a plan view and connected to pixels in a same row from among the plurality of pixels, and the plurality of first branches extending in a second direction from the first extension portion; a second scan line arranged on the substrate, extending in the first direction in a plan view, and being spaced apart from the first extension portion in the second direction; and a plurality of first contact plugs connecting the plurality of first branches to the second scan line.

20 Claims, 9 Drawing Sheets

(56) References Cited

U.S. PATENT DOCUMENTS

| | | | |
|---|---|---|---|
| 2011/0241526 A1* | 10/2011 | Huang | G09G 3/3648 |
| | | | 313/307 |
| 2016/0300533 A1* | 10/2016 | Lee | G09G 3/3266 |
| 2018/0240421 A1* | 8/2018 | Yamazaki | H01L 27/1244 |
| 2019/0115415 A1 | 4/2019 | Choi et al. | |

FOREIGN PATENT DOCUMENTS

| | | |
|---|---|---|
| KR | 10-2018-0025513 A | 3/2018 |
| KR | 10-1873723 B1 | 7/2018 |
| KR | 10-2019-0041553 A | 4/2019 |

\* cited by examiner

DISPLAY APPARATUS WITH INCREASED RELIABILITY

CROSS-REFERENCE TO RELATED APPLICATION

This application claims priority to and the benefit of Korean Patent Application No. 10-2021-0028965, filed on Mar. 4, 2021, in the Korean Intellectual Property Office, the disclosure of which is incorporated by reference herein in its entirety.

BACKGROUND

1. Field

One or more embodiments relate to a display apparatus.

2. Description of the Related Art

A display apparatus visually displays data. Display apparatuses are used as displays of miniaturized products such as mobile phones and used as displays of large-scale products such as televisions.

Recently, the usage of display apparatuses has become diversified. In addition, as display apparatuses have become thinner and lighter, the range of their use has gradually expanded. As the purpose of the display apparatuses has diversified, various designs have been attempted to improve the quality of the display apparatuses.

SUMMARY

One or more embodiments include a display apparatus with a reduced resistance of wirings configured to transfer electric signals to pixels.

Aspects of various embodiments are not limited to the aspects mentioned above, and other aspects that are not mentioned will be clearly understood by those of ordinary skill in the art from the description of the present disclose.

Additional aspects will be set forth in part in the description that follows and, in part, will be apparent from the description, or may be learned by practice of the presented embodiments of the disclosure.

According to one or more embodiments, a display apparatus includes a plurality of pixels arranged on a substrate, a first scan line arranged on the substrate and including a first extension portion and a plurality of first branches, the first extension portion extending in a first direction in a plan view and connected to pixels in a same row from among the plurality of pixels, and the plurality of first branches extending in a second direction from the first extension portion, a second scan line arranged on the substrate, extending in the first direction in a plan view, and being spaced apart from the first extension portion in the second direction, and a plurality of first contact plugs connecting the plurality of first branches to the second scan line.

A number of pixels arranged in a same row from among the plurality of pixels may be k, the plurality of pixels being arranged between first contact plugs that are adjacent to each other in the first direction from among the plurality of first contact plugs, where k is a natural number.

The display apparatus may further include a first initialization gate line arranged on the substrate, extending in the first direction in a plan view, and connected to pixels on a same row from among the plurality of pixels, a second initialization gate line arranged on the substrate, extending in the first direction in a plan view, and including a plurality of first portions and a plurality of second portions, the plurality of first portions being spaced apart in the second direction from the first initialization gate line, and the plurality of second portions partially overlapping at least a portion of the first initialization gate line, and a plurality of second contact plugs connecting the first initialization gate line to the second initialization gate line.

The plurality of first portions and the plurality of second portions of the second initialization gate line may be alternatingly arranged in the first direction.

The second initialization gate line may include a plurality of second branches each extending in the second direction from the plurality of first portions, and each of the plurality of second contact plugs may connect the first initialization gate line to the plurality of second branches.

A number of pixels arranged in a same row from among the plurality of pixels may be k, the plurality of pixels being arranged between second contact plugs that are adjacent to each other in the first direction from among the plurality of second contact plugs.

The first initialization gate line may include a second extension portion and a plurality of third branches, the second extension portion extending in the first direction in a plan view, and each of the plurality of third branches may include a first portion, a second portion, and a third portion, the first portion extending in the second direction from the second extension portion, the second portion extending in the first direction from the first portion, and the third portion extending in the second direction from the second portion.

Each of the plurality of pixels may include a light-emitting element, a driving thin-film transistor configured to control a current flowing through the light-emitting element according to a gate-source voltage, a compensation thin-film transistor configured to connect a drain of the driving thin-film transistor to a gate of the driving thin-film transistor in response to a scan signal, and a node connection pattern connecting the gate of the driving thin-film transistor to a drain of the compensation thin-film transistor, and the display apparatus may further include a data line arranged on the substrate, extending in the second direction in a plan view, and connected to pixels on a same column from among the plurality of pixels, and the third portion of the first initialization gate line may be arranged between the data line and the node connection pattern in a plan view.

The display apparatus may further include a plurality of gate patterns being spaced apart from each other in the first direction and at least partially overlapping one of the plurality of first portions of the second initialization gate line.

A number of the plurality of gate patterns at least partially overlapping one of the plurality of first portions of the second initialization gate line may be 3.

The display apparatus may further include a first conductive layer arranged on the substrate and including the first scan line, the first initialization gate line, and the plurality of gate patterns, and a second conductive layer arranged on the first conductive layer and including the second scan line and the second initialization gate line.

The second scan line may be arranged on the first scan line and may overlap at least a portion of the plurality of first branches.

The second scan line and the plurality of first contact plugs may be provided as one body.

The display apparatus may further include a semiconductor layer arranged between the substrate and the first scan line, the semiconductor layer including a plurality of active regions and a voltage line, the plurality of pixels including a respective active region of the plurality of active regions, and the voltage line being connected to the plurality of active regions.

According to one or more embodiments, a display apparatus includes a plurality of pixels arranged on a substrate, a first gate line arranged on the substrate, extending in a first direction in a plan view, and connected to pixels in a same row from among the plurality of pixels, a second gate line arranged on the substrate, extending in the first direction in a plan view, and including a plurality of first portions and a plurality of second portions, the plurality of first portions being spaced apart in a second direction from the first gate line, and the plurality of second portions overlapping at least a portion of the first gate line, and a plurality of contact plugs connecting the first gate line to the second gate line.

The plurality of first portions and the plurality of second portions of the second gate line may be alternatingly arranged in the first direction.

The second gate line may include a plurality of first branches each extending in the second direction from the plurality of first portions, and each of the plurality of contact plugs may connect the first gate line to the plurality of first branches.

A number of pixels arranged in a same row from among the plurality of pixels may be k, the plurality of pixels being arranged between contact plugs that are adjacent to each other in the first direction from among the plurality of contact plugs.

The first gate line may include an extension portion and a plurality of second branches, the extension portion extending in the first direction in a plan view, and each of the plurality of second branches may include a first portion, a second portion, and a third portion, the first portion extending in the second direction from the extension portion, the second portion extending in the first direction from the first portion, and the third portion extending in the second direction from the second portion.

The display apparatus may further include a plurality of gate patterns being spaced apart from each other in the first direction and at least partially overlapping one of the plurality of first portions of the second gate line.

These and/or other aspects will become apparent and more readily appreciated from the following description of the embodiments, the accompanying drawings, and claims.

These general aspects may be implemented by using a system, a method, a computer program, or a combination of a certain system, method, and computer program.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1:
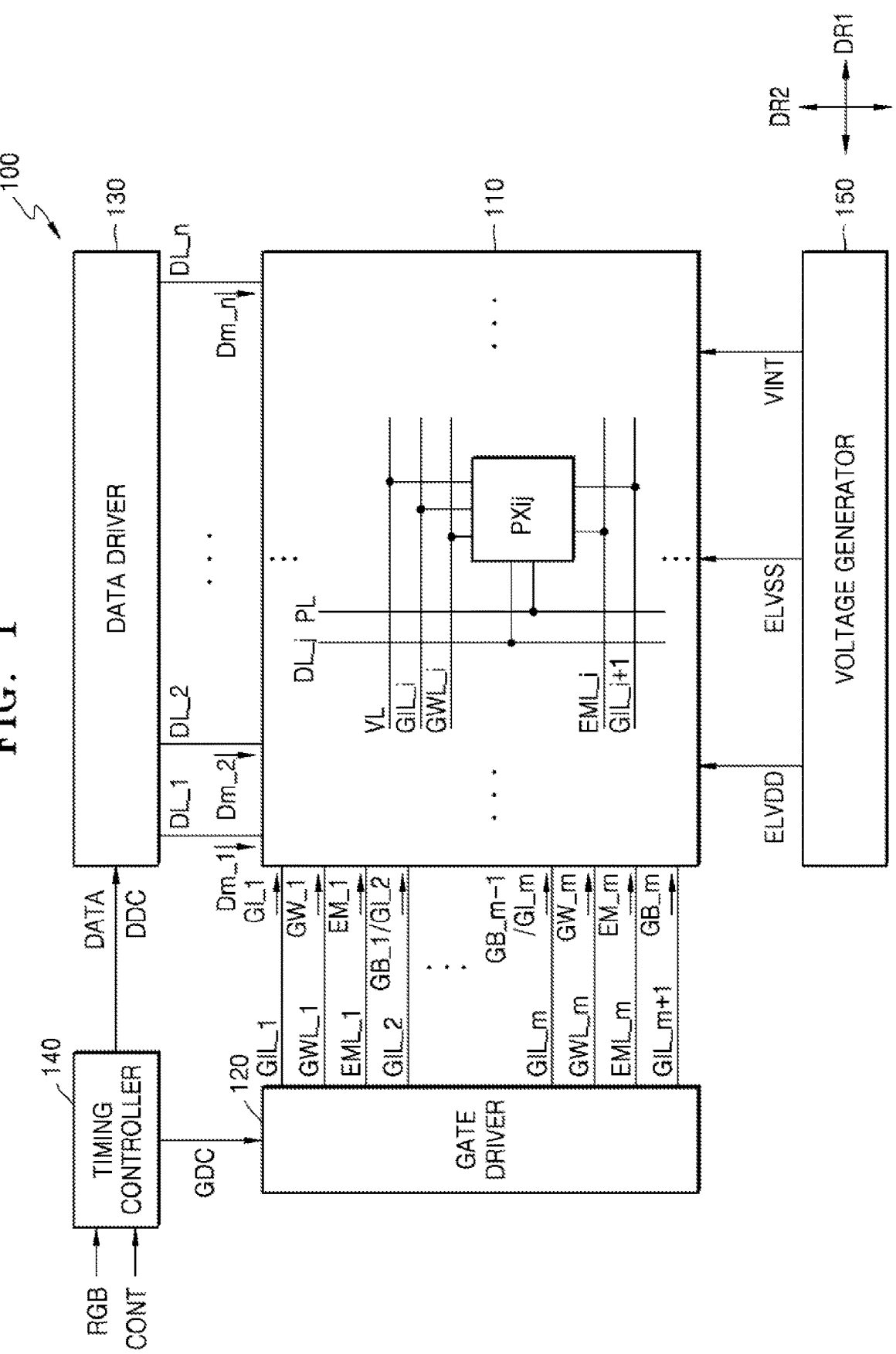
FIG. 1 is a block diagram of a display apparatus according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

When an embodiment may be implemented differently, a certain process order may be performed differently from the described order. For example, two consecutively described processes or steps may be performed substantially at the same time or performed in an order opposite to the described order.

A display apparatus includes a substrate including a display area and a non-display area. A gate line is insulated from a data line in the display area. A plurality of pixel regions are defined in the display area. Pixels respectively arranged in the plurality of pixel regions emit light by receiving electric signals from a gate line and a data line to display an image to the outside, wherein the gate line and the data line cross each other. Each pixel region includes a thin-film transistor and a pixel electrode electrically connected to the thin-film transistor. A common electrode is commonly provided to the pixel regions. Pads may be provided to the non-display area. Various wirings, a gate driver, a data driver, and a controller that are configured to transfer electric signals to the pixels inside the display area may be connected to the pads.

FIG. 1 is a block diagram of a display apparatus according to some embodiments. The display apparatus may be an organic light-emitting display including a light-emitting element, for example, an organic light-emitting diode, configured to change brightness thereof according to a current. Hereinafter, the case where the display apparatus is an organic light-emitting display apparatus is described.

Referring to FIG. 1, an organic light-emitting display apparatus 100 includes a display portion 110, a gate driver 120, a data driver 130, a timing controller 140, and a voltage generator 150.

In some embodiments, the display portion 110 includes pixels PX such as a pixel $PX_{ij}$ arranged on an i-th row and a j-th column. Although FIG. 1 shows only one pixel $PX_{ij}$ for ease of understanding, m×n pixels PX may be arranged in, for example, a matrix configuration. Here, i is a natural number equal to or less than m, and j is a natural number equal to or less than n.

In FIG. 1, a pixel PX that includes seven transistors and one capacitor is described by way of example for only descriptive purposes. However, the present disclosure is not only applicable to a pixel PX that employs such a pixel circuit (e.g., one that includes seven transistors and one capacitor) but may also be equally applicable to a pixel PX that employs a different pixel circuit, for example, a pixel circuit that includes two transistors and one capacitor, among other configurations.

In some embodiments, pixels PX are connected to scan lines GWL_1 to GWL_m, initialization gate lines GIL_1 to GIL_m+1, emission control lines EML_1 to EML_m, and data lines DL_1 to DL_n. The pixels PX may also be connected to a power line PL and a voltage line VL. As an example, as shown in FIG. 1, a pixel $PX_{ij}$ arranged on an i-th row and a j-th column may be connected to a scan line GWL_i, an initialization gate line GIL_i, an emission control line EML_i, a data line DL_j, the power line PL, the voltage line VL, and an initialization gate line GIL_i+1. With respect to a pixel $PX_{ij}$, the initialization gate line GIL_i+1 may be denoted as a next initialization gate line.

According to another example, a pixel $PX_{ij}$ may be connected to some of a scan line GWL_i, an initialization gate line GIL_i, an emission control line EML_i, a data line DL_j, the power line PL, the voltage line VL, and an initialization gate line GIL_i+1. As an example, a pixel $PX_{ij}$ may be connected to a scan line GWL_i, a data line DL_j, and a power line PL_j.

In some embodiments, the scan lines GWL_1 to GWL_m, the initialization gate lines GIL_1 to GIL_m+1, and the emission control lines EML_1 to EML_m may extend in a first direction DR1 (or a row direction) and may be connected to pixels PX in the same row. The data lines DL_1 to DL_n may extend in a second direction DR2 (or a column direction) and may be connected to pixels PX in the same column.

Figure 2:
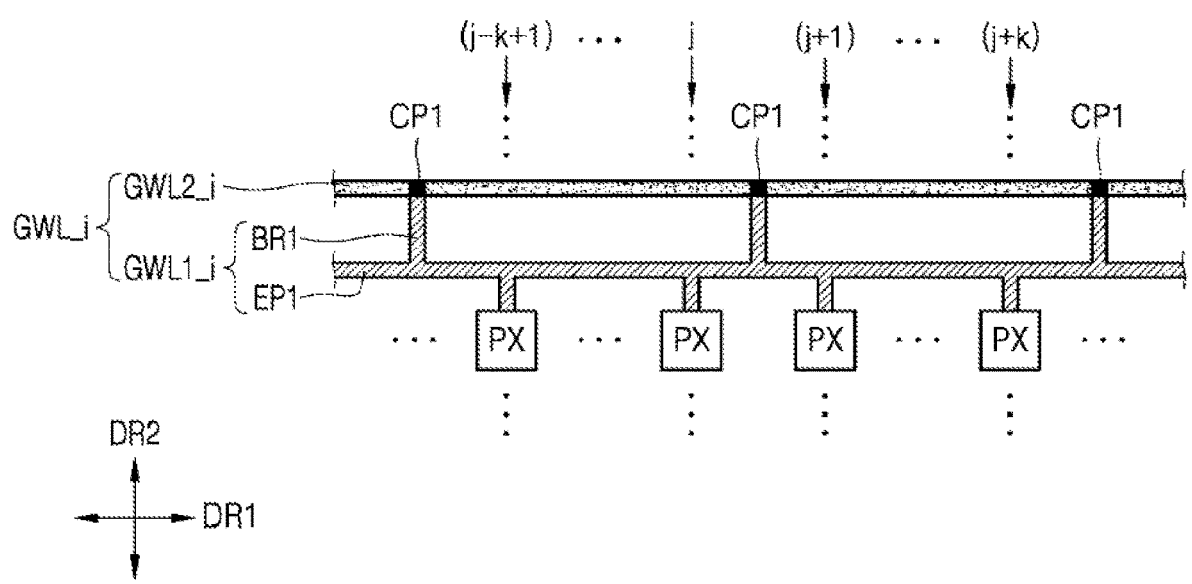
FIG. 2 is a view of a scan line according to some embodiments.
Figure 3:
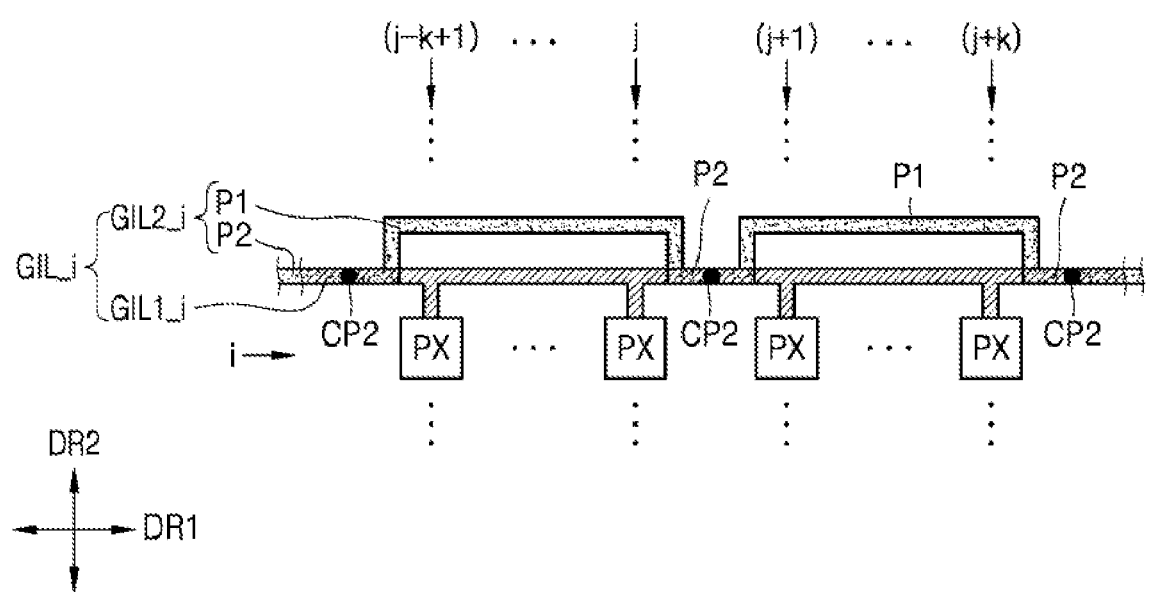
FIG. 3 is a view of an initialization gate line according to some embodiments.

Although FIG. 1 shows each of the scan lines GWL_1 to GWL_m as one line, each of the scan lines GWL_1 to GWL_m may be a double line as shown in FIG. 2 below. Each of the scan lines GWL_1 to GWL_m may include a first scan line and a second scan line. In some embodiments, although FIG. 1 shows each of the initialization gate lines GIL_1 to GIL_m+1 as one line, each of the initialization gate lines GIL_1 to GIL_m+1 may be a double line as shown in FIG. 3 below. That is, each of the initialization gate lines GIL_1 to GIL_m+1 may include a first initialization gate line and a second initialization gate line.

Figure 5:
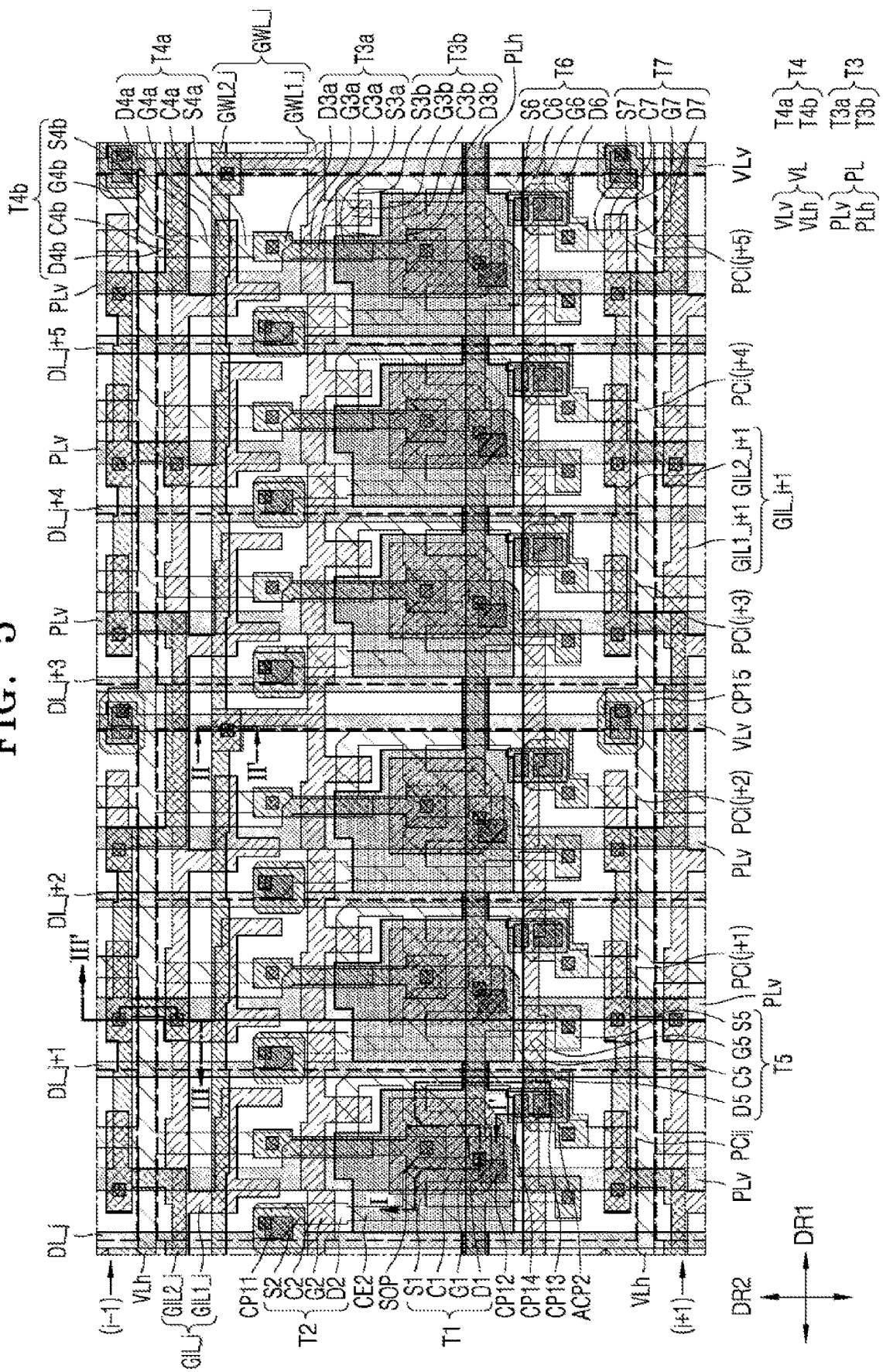
FIG. 5 is a plan view of a pixel circuit according to some embodiments.

In some embodiments, the power line PL may extend in the second direction DR2 and may be connected to pixels PX in the same column. Although it is shown in FIG. 1 that the power line PL extends in the second direction DR2, the power line PL may extend in the first direction DR1 in other embodiments. In other embodiments, the power line PL may include a plurality of horizontal power lines extending in the first direction DR1 and a plurality of vertical power lines extending in the second direction DR2 as shown in FIG. 5.

In some embodiments, the voltage line VL may extend in the first direction DR1 and may be connected to pixels PX in the same row. Although it is shown in FIG. 1 that the voltage line VL extends in the first direction DR1, the voltage line VL may extend in the second direction DR2 in other embodiments. In other embodiments, the voltage line VL may include a plurality of horizontal voltage lines extending in the first direction DR1 and a plurality of vertical voltage lines extending in the second direction DR2 as shown in FIG. 5.

In some embodiments, the scan lines GWL_1 to GWL_m are configured to respectively transfer scan signals GW_1 to GW_m output from the gate driver 120 to pixels PX in the same row. The initialization gate lines GIL_1 to GIL_m are configured to respectively transfer first initialization signals GI_1 to GI_m output from the gate driver 120 to the pixels PX in the same row. The initialization gate lines GIL_2 to GIL_m+1 are configured to respectively transfer second initialization signals GB_1 to GB_m output from the gate driver 120 to the pixels PX in the same row. In some embodiments, a first initialization signal GI_i and a second initialization signal GB_i−1 may be the same signals transferred through the initialization gate line GIL_i.

In some embodiments, the emission control lines EML_1 to EML_m are configured to respectively transfer emission control signals EM_1 to EM_m output from the gate driver 120 to the pixels PX in the same row. The data lines DL_1 to DL_n are configured to respectively transfer data voltages Dm_1 to Dm_n output from the data driver 130 to the pixels PX in the same column. A pixel $PX_{ij}$ arranged in an i-th row and a j-th column receives a scan signal GW_i, a first initialization signal GI_i, a second initialization signal GB_i, a data voltage Dm_j, and an emission control signal EM_i.

In some embodiments, the power line PL transfers a first driving voltage ELVDD output from the voltage generator 150 to the pixels PX in the same column. In another example, the first driving voltage ELVDD may be transferred to the pixels PX in the same row through a power line extending in the first direction DR1.

In some embodiments, the voltage line VL is configured to transfer an initialization voltage VINT output from the voltage generator 150 to the pixels PX in the same row. In another example, the initialization voltage VINT may be transferred to the pixels PX in the same column through a voltage line extending in the second direction DR2.

In some embodiments, a pixel $PX_{ij}$ includes a light-emitting element and a driving thin-film transistor configured to control the amount of current flowing through the light-emitting element based on a data voltage Dm_j. A data voltage Dm_j is output from the data driver 130 and received by a pixel $PX_{ij}$ through a data line DL_j. A light-emitting element may be, for example, an organic light-emitting diode. As the light-emitting element emits light at a brightness corresponding to the magnitude of a current received from the driving thin-film transistor, a pixel $PX_{ij}$ may express a grayscale corresponding to a data voltage Dm_j. A pixel PX may correspond to a portion, for example, a sub-pixel of a unit pixel that may display full colors (e.g., a red, a green, and a blue). A pixel $PX_{ij}$ may further include at least one switching thin-film transistor and at least one capacitor. A pixel $PX_{ij}$ is described below in more detail.

In some embodiments, the voltage generator 150 may generate voltages required for driving a pixel $PX_{ij}$. As an example, the voltage generator 150 may generate the first driving voltage ELVDD, a second driving voltage ELVSS, and the initialization voltage VINT. A level of the first driving voltage ELVDD may be greater than a level of the second driving voltage ELVSS. A level of the initialization voltage VINT may be greater than a level of the second driving voltage ELVSS. A difference between the initialization voltage VINT and the second driving voltage ELVSS may be less than a threshold voltage required for a light-emitting element of a pixel PX to emit light.

In some embodiments, the voltage generator 150 may generate a first gate voltage VGH and a second gate voltage VGL for controlling a switching thin-film transistor of a pixel $PX_{ij}$, and provide the same to the gate driver 120. When the first gate voltage VGH is applied to a gate of the switching thin-film transistor, the switching thin-film transistor may be turned off, and when the second gate voltage VGL is applied to the gate of the switching thin-film transistor, the switching thin-film transistor may be turned on. The first gate voltage VGH may be denoted by a turn-off voltage, and the second gate voltage VGL may be denoted by a turn-on voltage. Switching thin-film transistors of a pixel $PX_{ij}$ may be p-type metal oxide semiconductor field effect transistors (MOSFET), and a level of the first gate voltage VGH may be greater than a level of the second gate voltage VGL. In some embodiments, the voltage generator 150 may generate gamma reference voltages and provide the same to the data driver 130.

In some embodiments, a timing controller 140 may control the display portion 110 by controlling an operation timing of the gate driver 120 and the data driver 130. Pixels PX of the display portion 110 may receive a new data voltage Dm for each frame period and emit light with a brightness corresponding to the data voltage Dm, thereby displaying an image corresponding to an image source data RGB of one frame.

According to some embodiments, one frame period may include a gate initialization period, a data-writing and anode-initializing period, and a light-emitting period. During an initialization period, the initialization voltage VINT may be applied to pixels PX in synchronization with a first initialization signal GI. During a data-writing and anode-initializing period, a data voltage Dm may be provided to the pixels PX in synchronization with a scan signal GW, and the initialization voltage VINT may be applied to the pixels PX in synchronization with the second initialization signal GB. During a light-emitting period, the pixels PX of the display portion 110 may emit light.

In some embodiments, the timing controller 140 receives an image source data RGB and a control signal CONT from the outside (e.g., an external source). The timing controller 140 may convert image source data RGB to image data DATA based on the display portion 110, characteristics of the pixels PX, etc. The timing controller 140 may then provide image data DATA to the data driver 130.

In some embodiments, a control signal CONT may include a vertical synchronization signal Vsync, a horizontal synchronization signal Hsync, a data enable signal DE, and a clock signal CLK. The timing controller 140 may control an operation timing of the gate driver 120 and the data driver 130 by using a control signal CONT. The timing controller 140 may determine a frame period by counting a data enable signal DE of a horizontal scanning period. In this case, a vertical synchronization signal Vsync and a horizontal synchronization signal Hsync supplied from the outside may be omitted. Image source data RGB includes luminance information of pixels PX.

Luminance may have a preset number, for example, $1024(=2^{10})$, $256(=2^8)$, or $64(=2^6)$ gray scales.

In some embodiments, the timing controller 140 may generate control signals including a gate timing control signal GDC and a data timing control signal DDC. The gate timing control signal GDC may control an operation timing of the gate driver 120, and the data timing control signal DDC may control an operation timing of the data driver 130.

In some embodiments, the gate timing control signal GDC may include a gate start pulse GSP, a gate shift clock GSC, a gate output enable signal GOE. A gate start pulse GSP may be supplied to the gate driver 120 that generates a first scan signal at the start of a scanning period. A gate shift clock GSC is a clock signal input that is common to the gate driver 120 and is a signal for shifting a gate start pulse GSP. A gate output enable signal GOE controls an output of the gate driver 120.

In some embodiments, a data timing control signal DDC may include a source start pulse SSP, a source sampling clock SSC, and a source output enable signal SOE. A source start pulse SSP controls the sampling starting point of the data driver 130 and is provided to the data driver 130 at the start of a scanning period. A source sampling clock SSC is a clock signal that controls a sampling operation of data inside the data driver 130 based on a rising edge or a falling edge. A source output enable signal SOE controls an output of the data driver 130. A source start pulse SSP supplied to the data driver 130 may be omitted depending on a data transmission method.

In some embodiments, the gate driver 120 sequentially generates scan signals GW_1 to GW_m, first initialization signals GI_1 to GI_m, and second initialization signals GB_1 to GB_m in response to a gate timing control signal GDC supplied from the timing controller 140 by using the first and second gate voltages VGH an VGL supplied from the voltage generator 150.

In some embodiments, the data driver 130 samples and latches image data DATA supplied from the timing controller 140 in response to a data timing control signal DDC supplied from the timing controller 140, and converts the data to parallel data system data. When converting the data to parallel data system data, the data driver 130 converts image data DATA to a gamma-based voltage, and thus, converts the data to an analog data voltage. The data driver 130 provides data voltages Dm_1 to Dm_n to the pixels PX through the data lines DL_1 to DL_n. The pixels PX receive data voltages Dm_1 to Dm_n in response to scan signals GW_1 to GW_m.

FIG. 2 is a view of a scan line according to some embodiments.

Referring to FIG. 2, the organic light-emitting display apparatus includes pixels PX such as a pixel PX$_{ij}$ arranged in an i-th row and a j-th column. In addition, the organic light-emitting display apparatus includes a scan line GWL_i connected to pixels in an i-th row from among the plurality of pixels PX.

The scan line GWL_i may include a first scan line GWL1_i and a second scan line GWL2_i.

In some embodiments, the first scan line GWL1_i may include a first extension portion EP1 extending in the first direction DR1, and a plurality of first branches BR1. Each of the first branches BR1 may extend from the first extension portion EP1 in the second direction DR2.

The second scan line GWL2_i may extend in the first direction DR1. The second scan line GWL2_i may be spaced apart in the second direction DR2 from the first extension portion EP1 of the first scan line GWL1_i in a plan view.

In some embodiments, the first scan line GWL1_i may be connected to the second scan line GWL2_i through a plurality of first contact plugs CP1. As an example, as shown in FIG. 2, each of the first branches BR1 of the first scan line GWL1_i may be connected to the second scan line GWL2_i through the first contact plugs CP1. The second scan line GWL2_i may overlap at least a portion of the first branches BR1 of the first scan line GWL1_i that extend in the second direction DR2 and may be connected to the first branches BR1 of the first scan line GWL1_i through the first contact plugs CP1.

Although it is shown in FIG. 2 that the first scan line GWL1_i includes the first branches BR1, the second scan line GWL2_i may include the branches according to other embodiments. In this case, the first scan line GWL1_i may overlap at least a portion of the branches of the second scan line GWL2_i and may be connected to the branches of the second scan line GWL2_i through contact plugs.

Figure 8:
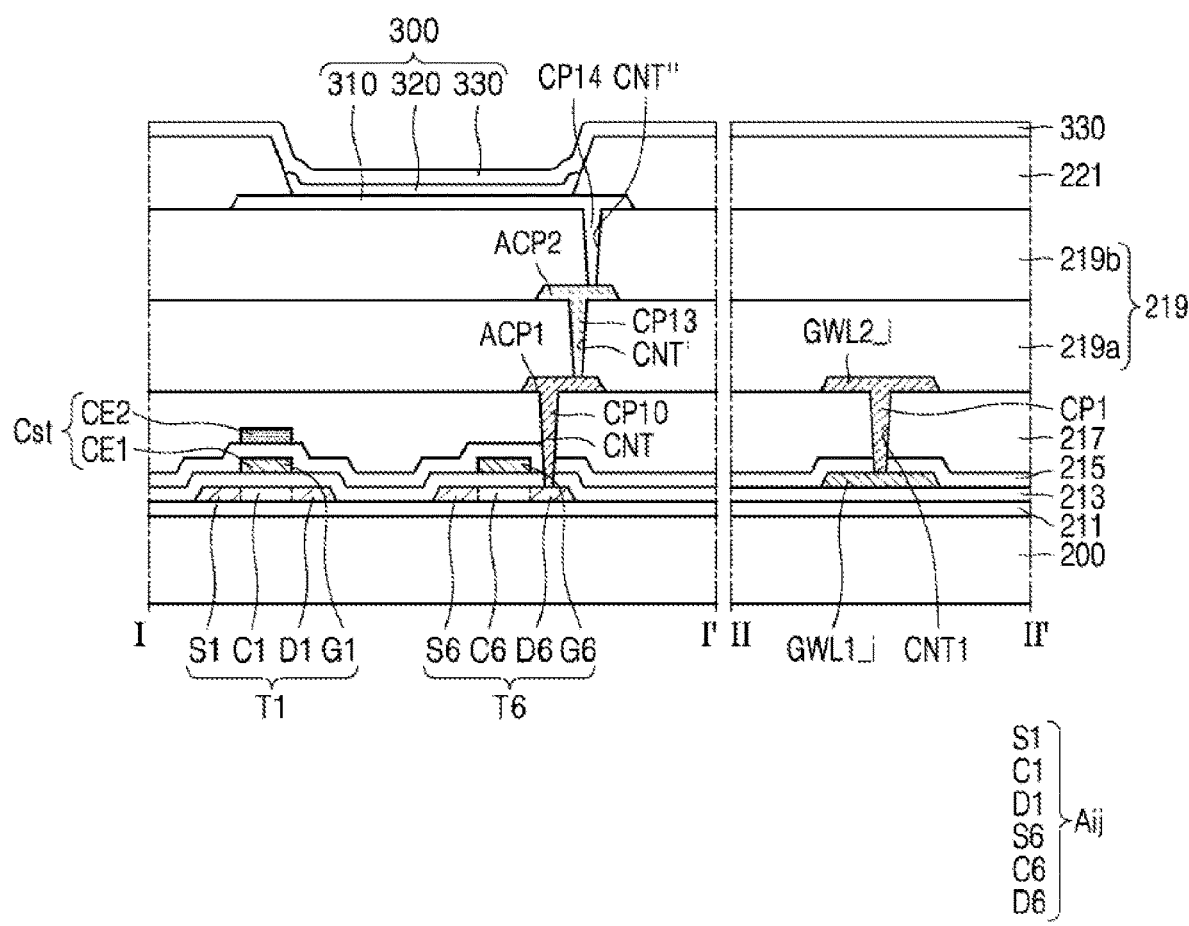
FIG. 8 is a cross-sectional view of the pixel circuit of FIG. 5, taken along the lines I-I' and II-II'.

Each of the first contact plugs CP1 may correspond to a portion of a conductive layer as shown in FIG. 8. Each of the first contact plugs CP1 may correspond to a portion of a conductive layer buried in a contact hole defined by an insulating layer.

In some embodiments, the number of pixels in an i-th row from among the plurality of pixels PX may be k, wherein the plurality of pixels PX are located between first contact plugs CP1 that are adjacent to each other in the first direction DR1 from among the plurality of first contact plugs CP1. Here, k is a natural number. In some embodiments, the number of first contact plugs CP1 arranged in an i-th row may be adjusted. When the number of first contact plugs CP1 is adjusted, a region in which pixels PX may be arranged may be adjusted.

As described above with reference to FIG. 1, the gate driver 120 may output a scan signal GW_i to the scan line GWL_i. Because the scan line GWL_i may include the first scan line GWL1_i and the second scan line GWL2_i, the gate driver 120 may output a scan signal GW_i to at least one of the first scan line GWL1_i and the second scan line GWL2_i.

In some embodiments, a linear resistance of the first scan line GWL1_i may be different from a linear resistance of the second scan line GWL2_i. As an example, a linear resistance of the second scan line GWL2_i may be less than a linear resistance of the first scan line GWL1_i. However, because the first scan line GWL1_i is connected in parallel to the second scan line GWL2_i, which has a relatively small linear resistance, an entire linear resistance (e.g., the overall linear resistance) of the first scan line GWL1_i and the second scan line GWL2_i may be reduced.

In some embodiments, the gate driver 120 may output a scan signal GW_i to the second scan line GWL2_i or output a scan signal GW_i to both the first scan line GWL1_i and the second scan line GWL2_i.

In some embodiments, each of the pixels PX in the same row may receive a scan signal GW_i through the second scan line GWL2_i having a relatively small linear resistance. Because the pixels PX in the same row may receive a scan signal GW_i through the second scan line GWL2_i having a relatively small linear resistance, each of the pixels PX in the same row may receive a scan signal GW_i with a reduced or relatively shorter signal delay.

In addition, because the first scan line GWL1_i and the second scan line GWL2_i each continuously extend in the first direction DR1, even if one of the plurality of first contact plugs CP1 is defective, the pixels PX in an i-th row may still each receive a scan signal GW_i. Accordingly, a defect rate of the display apparatus may be reduced.

FIG. 3 is a view of an initialization gate line according to some embodiments.

Referring to FIG. 3, the organic light-emitting display apparatus includes pixels PX such as a pixel PX$_{ij}$ arranged in an i-th row and a j-th column. In addition, the organic light-emitting display apparatus includes an initialization gate line GIL_i as a gate line connected to pixels in an i-th row from among the plurality of pixels PX.

In some embodiments, the initialization gate line GIL_i includes a first initialization gate line GIL1_i and a second initialization gate line GIL2_i. The first initialization gate line GIL1_i and the second initialization gate line GIL2_i may each extend in the first direction DR1.

The second initialization gate line GIL2_i may include a plurality of first portions P1 and a plurality of second portions P2.

The first portions P1 of the second initialization gate line GIL2_i may each extend in the first direction DR1 in a plan view and may be spaced apart in the second direction DR2 from the first initialization gate line GIL1_i. The second portions P2 of the second initialization gate line GIL2_i may each extend in the first direction DR1 in a plan view and overlap at least a portion of the first initialization gate line GIL1_i.

In some embodiments, as shown in FIG. 3, the first portions P1 and the second portions P2 may be alternately arranged in the first direction DR1.

The first initialization gate line GIL1_i may be connected to the second initialization gate line GIL2_i through a plurality of contact plugs CP2. As an example, as shown in FIG. 3, the second contact plugs CP2 may each be arranged to correspond to portions in which the first initialization gate line GIL1_i overlaps the second initialization gate line GIL2_i. The second contact plugs CP2 may each be arranged to correspond to the second portions P2 of the second initialization gate line GIL2_i. The second portions P2 of the first initialization gate line GIL1_i and the second initialization gate line GIL2_i may be connected to each other through the second contact plugs CP2.

Figure 7:
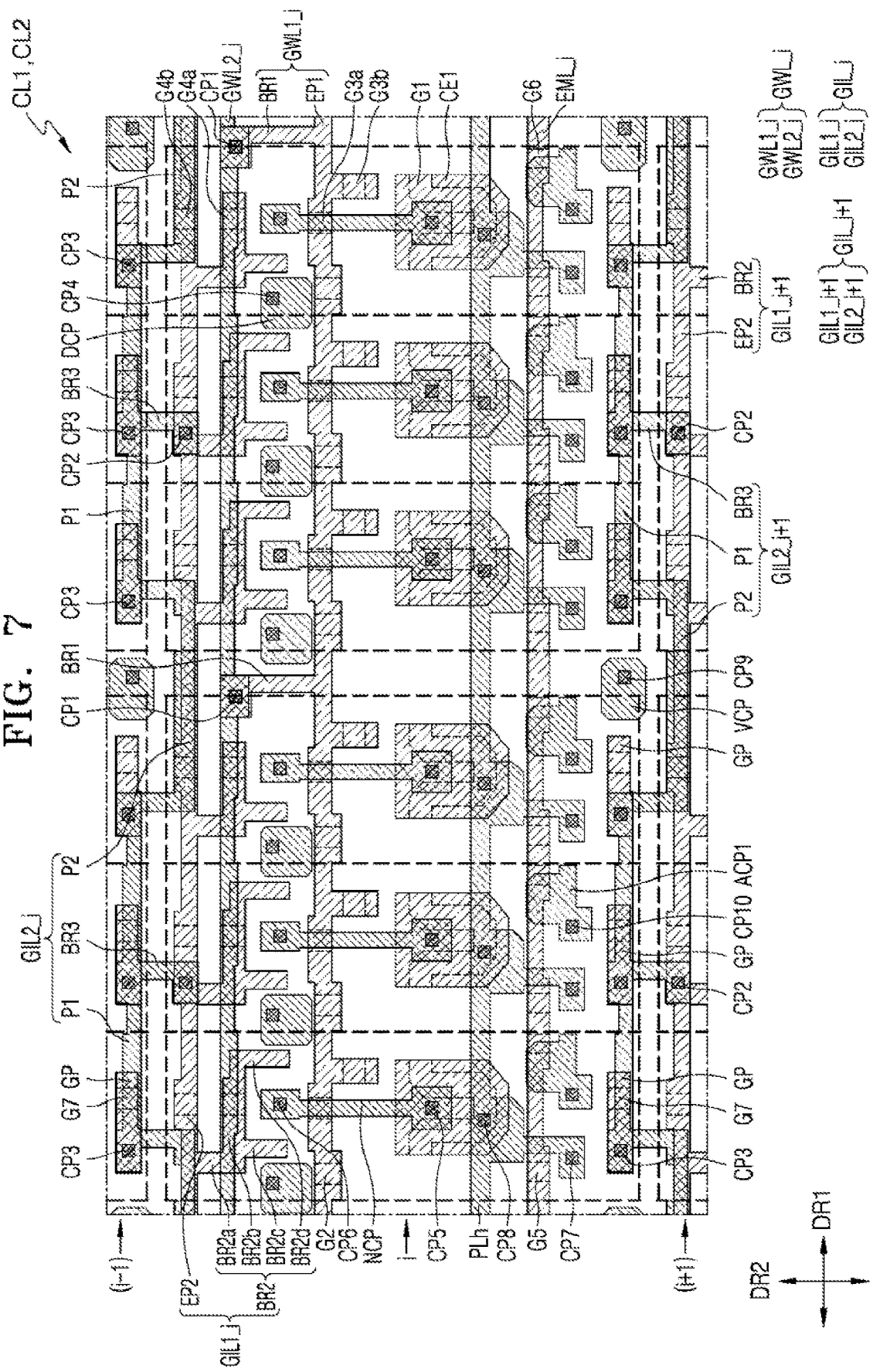
FIG. 7 is a plan view of conductive layers of FIG. 5.

Although it is shown in FIG. 3 that the second contact plugs CP2 each are arranged to correspond to the second portions P2 of the second initialization gate line GIL2_i, in some embodiments, the second initialization gate line GIL2_i may include branches each extending in the second direction DR2 from the first portions P1 of the second initialization gate line GIL2_i, and the second contact plugs CP2 may overlap the branches in other embodiments as shown in FIGS. 5 and 7. In some embodiments, the first initialization gate line GIL1_i may overlap a portion of the branches each extending in the second direction DR2 and may be connected to the second initialization gate line GIL2_i through the second contact plugs CP2.

In other embodiments, the first initialization gate line GIL1_i may include branches each extending in the second direction DR2 from the first initialization gate line GIL1_i, and the second contact plugs CP2 may each overlap the branches. The second initialization gate line GIL2_i may overlap at least a portion of the branches each extending in the second direction DR2 and be connected to the first initialization gate line GIL1_i through the second contact plugs CP2.

In some embodiments, the second contact plugs CP2 may each correspond to a portion of a conductive layer as shown in FIG. 8 below. The second contact plugs CP2 may each correspond to a portion of the conductive layer buried inside a contact hole defined by the insulating layer.

In some embodiments, the number of pixels in an i-th row from among the plurality of pixels PX may be k, where the plurality of pixels PX are located between second contact plugs CP2 that are adjacent to each other in the first direction DR1 from among the plurality of second contact plugs CP2. Here, k is a natural number. In some embodiments, the number of second contact plugs CP2 arranged in an i-th row may be adjusted. When the number of second contact plugs CP2 is adjusted, a region in which pixels PX may be arranged may be adjusted.

As described above with reference to FIG. 1, the gate driver 120 may output a first initialization signal GI_i to the initialization line GIL_i. Because the initialization gate line GIL_i includes the first initialization gate line GIL1_i and the second initialization gate line GIL2_i, the gate driver 120 may output a first initialization signal GI_i to at least one of the first initialization gate line GIL1_i and the second initialization gate line GIL2_i.

In some embodiments, a resistance of the first initialization gate line GIL1_i may be different from a resistance of the second initialization gate line GIL2_i. As an example, a linear resistance of the second initialization gate line GIL2_i may be less than a linear resistance of the first initialization gate line GIL1_i. Because the first initialization gate line GIL1_i is connected in parallel to the second initialization gate line GIL2_i, which has a relatively small linear resistance, an entire linear resistance (e.g., the overall linear resistance) of the first initialization gate line GIL1_i and the second initialization gate line GIL2_i may be reduced.

In some embodiments, the gate driver 120 may output a first initialization signal GI_i to the second initialization gate line GIL2_i or output a first initialization signal GI_i to both the first initialization gate line GIL1_i and the second initialization gate line GIL2_i.

In some embodiments, pixels PX in the same row may receive a first initialization signal GI_i through the second initialization gate line GIL2_i having a relatively small linear resistance. Because the pixels PX in the same row may receive a first initialization signal GI_i through the second initialization gate line GIL2_i having a relatively small linear resistance, each of the pixels PX in the same row may receive a first initialization signal GI_i with a reduced or relatively shorter signal delay.

In addition, because the first initialization gate line GIL1_i and the second initialization gate line GIL2_i each continuously extend in the first direction DR1, even though one of the plurality of second contact plugs CP2 is defective, the pixels PX in an i-th row may each receive a first initialization signal GI_i. Accordingly, a defect rate of the display apparatus may be reduced.

As shown in FIG. 3, the initialization gate line GIL_i may include the first initialization gate line GIL1_i and the second initialization gate line GIL2_i overlapping each other. This is merely one example, and in other embodiments, the initialization gate line GIL_i may include the first initialization gate line and the second initialization gate line spaced apart from each other in the second direction DR2 in a plan view, similar to the scan line GWL_i shown in FIG. 2. In this case, one of the first initialization gate line and the second initialization gate line may include branches extending in the second direction DR2.

Figure 4:
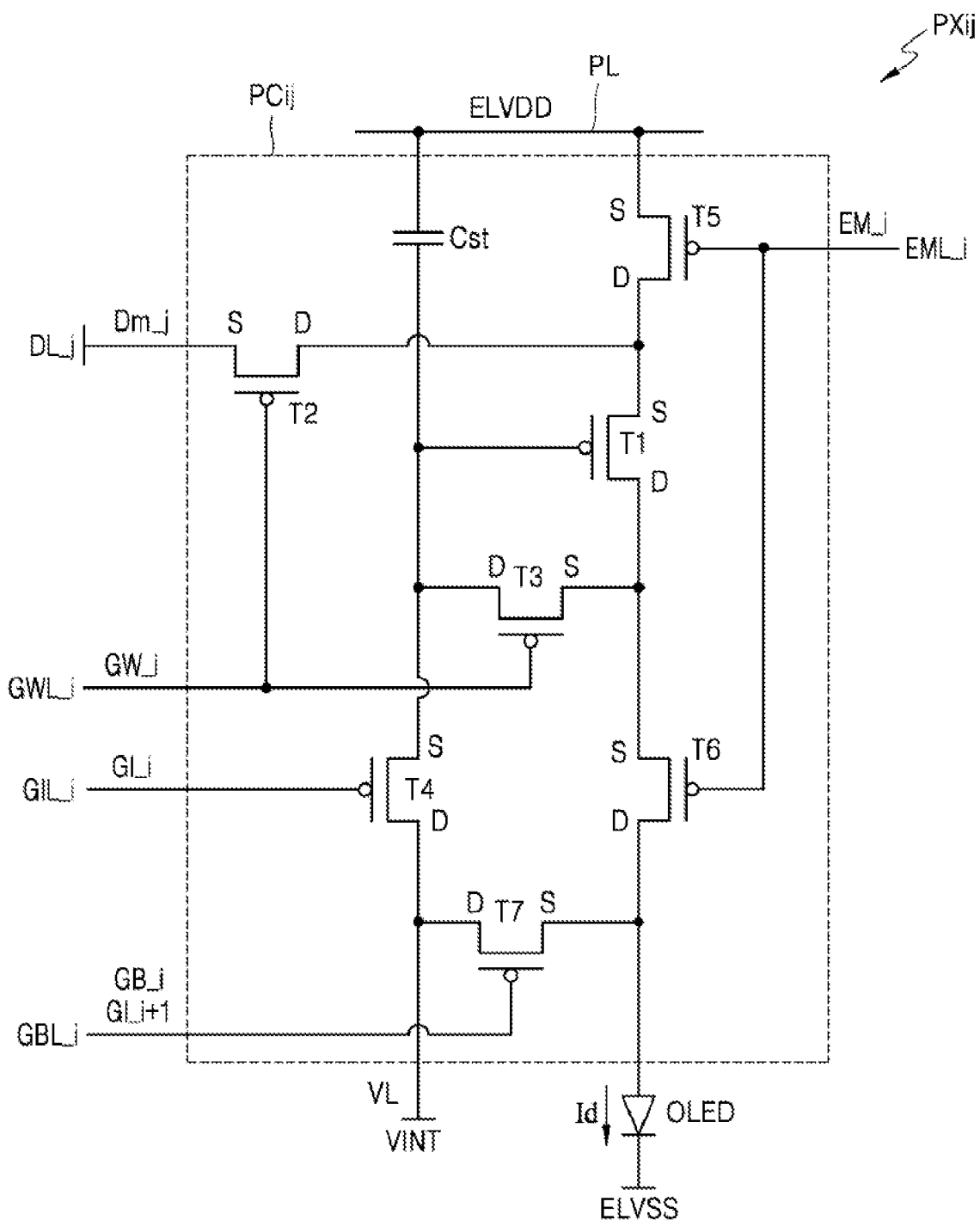
FIG. 4 is an equivalent circuit of a pixel according to some embodiments.

FIG. 4 is an equivalent circuit of a pixel according to some embodiments.

Referring to FIG. 4, a pixel $PX_{ij}$ includes a pixel circuit $PC_{ij}$ and a light-emitting element OLED connected to the pixel circuit $PC_{ij}$.

In some embodiments, the pixel circuit $PC_{ij}$ is connected to the scan line GWL_i, initialization gate lines GIL_i and GBL_i, a data line DL_j, and an emission control line EML_i, the scan line GWL_i being configured to transfer a scan signal GW_i, the initialization gate lines GIL_i and GBL_i being configured to respectively transfer first and second initialization signals GI_i and GB_i, the data line DL_j being configured to transfer a data voltage Dj, and the emission control line EML_i being configured to transfer an emission control signal EM_i. In some embodiments, the pixel circuit $PC_{ij}$ is connected to the power line PL and the voltage line VL, the power line PL being configured to transfer the first driving voltage ELVDD, and the voltage line VL being configured to transfer the initialization voltage VINT. The pixel circuit $PC_{ij}$ is connected to a common electrode to which the second driving voltage ELVSS is applied. The pixel $PX_{ij}$ including the pixel circuit $PC_{ij}$ may correspond to the pixel $PX_{ij}$ of FIG. 1.

In some embodiments, the pixel $PX_{ij}$ includes the light-emitting element OLED, first to seventh thin-film transistors T1, T2, T3, T4, T5, T6, and T7, and a storage capacitor Cst. The light-emitting element OLED may be an organic light-emitting diode including an anode and a cathode. The cathode may be a common electrode to which the second driving voltage ELVSS is applied.

In some embodiments, the first thin-film transistor T1 may be a driving transistor in which a drain current thereof is determined according to a gate-source voltage. The second to seventh thin-film transistors T2, T3, T4, T5, T6, and T7 may be switching transistors that are turned on or off according to a gate-source voltage or a gate voltage.

In some embodiments, the first thin-film transistor T1 may be denoted by a driving thin-film transistor, the second thin-film transistor T2 may be denoted by a scan thin-film transistor, the third thin-film transistor T3 may be denoted by a compensation thin-film transistor, the fourth thin-film transistor T4 may be denoted by a gate initialization thin-film transistor, the fifth thin-film transistor T5 may be denoted by a first emission control thin-film transistor, the sixth thin-film transistor T6 may be denoted by a second emission control thin-film transistor, and the seventh thin-film transistor T7 may be denoted by an anode initialization thin-film transistor.

In some embodiments, the storage capacitor Cst is connected between the power line PL and a gate of the driving thin-film transistor T1. The storage capacitor Cst may include a top electrode CE2 and a bottom electrode CE1, the top electrode CE2 being connected to the power line PL, and the bottom electrode CE1 being connected to the gate of the driving thin-film transistor T1.

In some embodiments, the driving thin-film transistor T1 may control the amount of current Id flowing from the power line PL to the light-emitting element OLED. The driving thin-film transistor T1 may include the gate, a source, and a drain, the gate being connected to the bottom electrode CE1 of the storage capacitor Cst, the source being connected to the power line PL through the first emission control thin-film transistor T5, and the drain being connected to the light-emitting element OLED through the second emission control thin-film transistor T6.

In some embodiments, the driving thin-film transistor may output the driving current Id to the light-emitting element OLED according to a gate-source voltage. The amount of the driving current Id is determined based on a difference between the gate-source voltage of the driving thin-film transistor T1 and a threshold voltage. The light-emitting element OLED may receive the driving current Id from the driving thin-film transistor T1 and emit light having a brightness corresponding to the amount of the driving current Id.

In some embodiments, the scan thin-film transistor T2 is configured to transfer a data voltage Dmj to the driving thin-film transistor T1 in response to a scan signal GW_i. The scan thin-film transistor T2 may include a gate, a source, and a drain, the gate being connected to the scan line GWL_i, the source being connected to the data line DL_j, and the drain being connected to the source of the driving thin-film transistor T1.

In some embodiments, the compensation thin-film transistor T3 is connected between the drain and the gate of the driving thin-film transistor T1 and connects the drain to the gate of the driving thin-film transistor T1 in response to a scan signal GW_i. The compensation thin-film transistor T3 may include a gate, a source, and a drain, the gate being connected to the scan line GWL_i, the source being connected to the drain of the driving thin-film transistor T1, and the drain being connected to the gate of the driving thin-film transistor T1.

Although it is shown in FIG. 3 that the compensation thin-film transistor T3 includes one thin-film transistor, the compensation thin-film transistor T3 may include two thin-film transistors which are connected to each other in series in other embodiments. As an example, as shown in FIG. 5, the compensation thin-film transistor T3 may include a first compensation thin-film transistor T3a and a second compensation thin-film transistor T3b which are connected to each other in series.

In some embodiments, the gate initialization thin-film transistor T4 applies the initialization voltage VINT to the gate of the driving thin-film transistor T1 in response to a first initialization signal GI_i. The gate initialization thin-film transistor T4 may include a gate, a source, and a drain, the gate being connected to the initialization gate line GIL_i, the source being connected to the gate of the driving thin-film transistor T1, and the drain being connected to the voltage line VL.

Although it is shown in FIG. 3 that the gate initialization thin-film transistor T4 includes one thin-film transistor, the gate initialization thin-film transistor T4 may include two thin-film transistors which are connected to each other in series in other embodiments. As an example, as shown in FIG. 5 below, the gate initialization thin-film transistor T4 may include a first gate initialization thin-film transistor T4a and a second gate initialization thin-film transistor T4b which are connected to each other in series.

In some embodiments, the anode initialization thin-film transistor T7 applies the initialization voltage VINT to an anode of the light-emitting element OLED in response to a second initialization signal GB_i. The anode initialization thin-film transistor T7 may include a gate, a source, and a drain, the gate being connected to the initialization gate line GBL_i, the source being connected to the anode of the light-emitting element OLED, and the drain being connected to the voltage line VL.

In some embodiments, the first emission control thin-film transistor T5 may connect the power line PL to the source of the driving thin-film transistor T1 in response to an emission control signal EM_i. The first emission control thin-film transistor T5 includes a gate, a source, and a drain, the gate being connected to the emission control line EML_i, the source being connected to the power line PL, and the drain being connected to the source of the driving thin-film transistor T1.

In some embodiments, the second emission control thin-film transistor T6 may connect the drain of the driving thin-film transistor T1 to the anode of the light-emitting element OLED in response to an emission control signal EM_i. The second emission control thin-film transistor T6 may include a gate, a source, and a drain, the gate being connected to the emission control line EML_i, the source being connected to the drain of the driving thin-film transistor T1, and the drain being connected to the anode of the light-emitting element OLED.

In some embodiments, a first initialization signal GI_i may be substantially synchronized with a scan signal GW_i−1 of the previous row. A second initialization signal GB_i may be substantially synchronized with a scan signal GW_i. According to other embodiments, a second initialization signal GB_i may be substantially synchronized with a scan signal GW_i+1 of the next row.

Hereinafter, an example of an operation process for one pixel of the organic light-emitting display apparatus according to some embodiments is described in more detail.

First, when an emission control signal EM_i of a high level is received, the first emission control thin-film transistor T5 and the second emission control thin-film transistor T6 are turned off, and the driving thin-film transistor T1 stops the outputting of the driving current Id, and the light-emitting element OLED stops the emitting of light.

Then, during the gate initialization period in which a first initialization signal GI_i of a low level is received, the gate initialization thin-film transistor T4 is turned on, and the initialization voltage VINT is applied to the gate of the driving thin-film transistor T1, that is, to the bottom electrode of the storage capacitor Cst. A difference (ELVDD−VINT) between the first driving voltage ELVDD and the initialization voltage VINT is stored in the storage capacitor Cst.

Then, during a data-writing period in which a received scan signal GW_i is a low level, the scan thin-film transistor T2 and the compensation thin-film transistor T3 are turned on, and the data voltage Dm_j is received by the source of the driving thin-film transistor T1. The driving thin-film transistor T1 is diode-connected and forward-biased by the compensation thin-film transistor T3. A gate voltage of the driving thin-film transistor T1 is raised (e.g., increased) from the initialization voltage VINT. When the gate voltage of the driving thin-film transistor T1 becomes the same or substantially the same as a data compensation voltage (Dm_j−|Vth|) that is obtained by subtracting a threshold voltage Vth of the driving thin-film transistor T1 from a data voltage Dm_j, the driving thin-film transistor T1 is turned off and the rising (e.g., increasing) of the gate voltage of the driving thin-film transistor T1 stops. Accordingly, a difference (ELVDD−Dm_j+|Vth|) between the first driving voltage ELVDD and the data compensation voltage (Dm_j−|Vth|) is stored in the storage capacitor Cst.

In addition, during an anode initialization period in which a second initialization signal GB_i of a low level is received, the anode initialization thin-film transistor T7 is turned on and the initialization voltage VINT is applied to the anode of the light-emitting element OLED. Because the light-emitting element OLED is allowed to completely not emit light by applying the initialization voltage VINT to the anode of the light-emitting element OLED, a phenomenon where the light-emitting element OLED minutely emits light in response to a black grayscale during the next frame may be removed or avoided.

In some embodiments, a scan signal GW_i may be substantially synchronized with the second initialization signal GB_i. In this case, a data-writing period may be the same or substantially the same as the anode initialization period.

In some embodiments, when an emission control signal EM_i of a low level is received, the first emission control thin-film transistor T5 and the second emission control thin-film transistor T6 are tuned on, the driving thin-film transistor T1 may output the driving current Id, and the light-emitting element OLED may emit light corresponding to the amount of driving current Id. The driving current may correspond to the voltage stored in the storage capacitor Cst, that is, the voltage ELVDD−Dm_j obtained by subtracting the threshold voltage |Vth| of the driving thin-film transistor T1 from the source-gate voltage (ELVDD−Dm_j+|Vth|) of the driving thin-film transistor T1.

Figure 6:
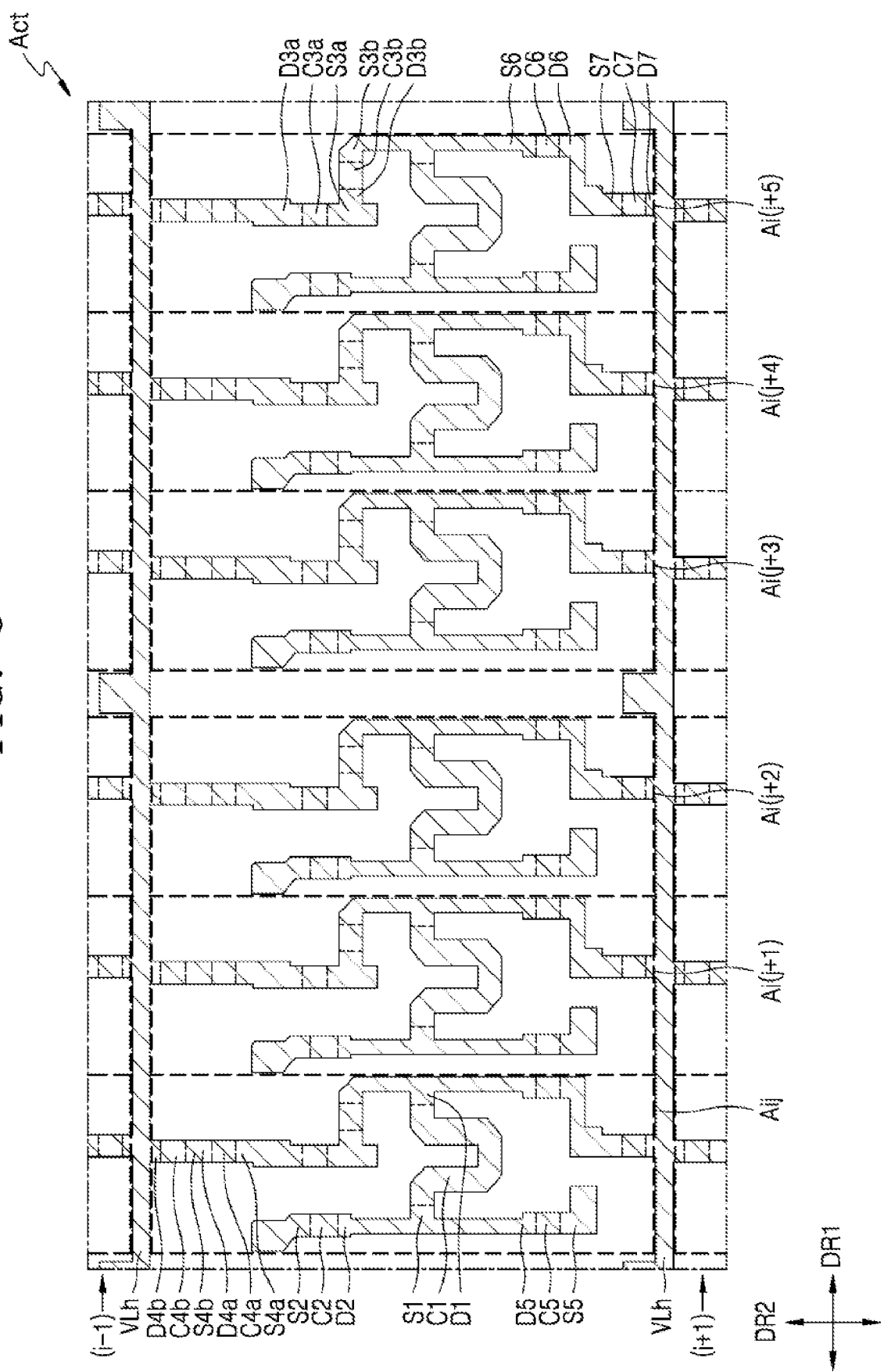
FIG. 6 is a plan view of a semiconductor layer of FIG. 5.

FIG. 5 is a plan view of a pixel circuit according to some embodiments. FIG. 6 is a plan view of a semiconductor layer of FIG. 5, and FIG. 7 is a plan view of conductive layers of FIG. 5.

FIG. 5 shows pixel circuits $PC_{ij}$, $PC_{i(j+1)}$, $PC_{i(j+2)}$, $PC_{i(j+3)}$, $PC_{i(j+4)}$, and $PC_{i(j+5)}$. Because the pixel circuits $PC_{ij}$, $PC_{i(j+1)}$, $PC_{i(j+2)}$, $PC_{i(j+3)}$, $PC_{i(j+4)}$, and $PC_{i(j+5)}$ are arranged in the same row, the pixel circuits $PC_{ij}$, $PC_{i(j+1)}$, $PC_{i(j+2)}$, $PC_{i(j+3)}$, $PC_{i(j+4)}$, and $PC_{i(j+5)}$ may be connected to the same scan line GWL_i, the same initialization gate lines GIL_i and GIL_i+1, and the same emission control line EML_i.

In some embodiments, as shown in FIG. 5, the scan line GWL_i may include the first scan line GWL1_i and the second scan line GWL2_i. The first scan line GWL1_i may be connected to the second scan line GWL2_i through a plurality of first contact plugs CP1 (see FIG. 7).

In some embodiments, as shown in FIG. 5, the initialization gate line GIL_i includes the first initialization gate line GIL1_i and the second initialization gate line GIL2_i. The first initialization gate line GIL1_i may be connected to the second initialization gate line GIL2_i through the plurality of second contact plugs CP2 (see FIG. 7). An initialization gate line GIL_i+1 includes a first initialization gate line GIL1_i+1 and a second initialization gate line GIL2_i+1. The first initialization gate line GIL1_i+1 may be connected to the second initialization gate line GIL2_i+1 through a plurality of second contact plugs CP2.

In some embodiments, the pixel circuits $PC_{ij}$, $PC_{i(j+1)}$, $PC_{i(j+2)}$, $PC_{i(j+3)}$, $PC_{i(j+4)}$, and $PC_{i(j+5)}$ arranged in an i-th row may be respectively connected to different data lines DL_j, DL_j+1, DL_j+2, DL_j+3, DL_j+4, and DL_j+5. Each of the data lines DL_j, DL_j+1, DL_j+2, DL_j+3, DL_j+4, and DL_j+5 may extend in the second direction DR2 and may be connected to pixel circuits in the same column.

In some embodiments, the pixel circuits $PC_{ij}$, $PC_{i(j+1)}$, $PC_{i(j+2)}$, $PC_{i(j+3)}$, $PC_{i(j+4)}$, and $PC_{i(j+5)}$ may be connected to the power line PL and the voltage line VL, the power line PL being configured to transfer the driving voltage ELVDD (see FIG. 4), and the voltage line VL being configured to transfer the initialization voltage VINT (see FIG. 4).

In some embodiments, the power line PL may include a horizontal power line PLh (see FIG. 7) and a vertical power line PLv. The horizontal power line PLh may be connected to the vertical power line PLv through a twelfth contact plug CP12. The horizontal power line PLh may be connected to the vertical power line PLv at the intersection portion thereof. A plurality of the horizontal power line PLh and the vertical power line PLv may be provided. A planar shape of the power line PL including the plurality of horizontal power lines PLh and the plurality of vertical power lines PLv may be a mesh structure. In other words, the power line PL including the plurality of horizontal power lines PLh and the plurality of vertical power lines PLv may have the shape of a mesh structure in a plan view.

In some embodiments, as shown in FIG. 5, the voltage line VL may include a horizontal voltage line VLh and a vertical voltage line VLv. The horizontal voltage line VLh may be connected to the vertical voltage line VLv through an initialization connection pattern VCP (see FIG. 7), a ninth contact plug CP9 (see FIG. 7), and a fifteenth contact plug CP15. The horizontal voltage line VLh may be connected to the vertical voltage line VLv at the intersection portion thereof. A plurality of the horizontal voltage line VLh and the vertical voltage line VLv may be provided. A planar shape of the voltage line VL including the plurality of horizontal voltage lines VLh and the plurality of vertical voltage lines VLv may be a mesh structure. In other words, the voltage line VL including the plurality of horizontal voltage lines VLh and the plurality of vertical voltage lines VLv may have the shape of a mesh structure in a plan view.

The twelfth contact plug CP12, the ninth contact plug CP9, and the fifteenth contact plug CP15 may each correspond to a portion of the conductive layer. The twelfth contact plug CP12, the ninth contact plug CP9, and the fifteenth contact plug CP15 may correspond to a portion of the conductive layer buried inside a contact hole defined by the insulating layer.

Hereinafter, elements included in each of the pixel circuits $PC_{ij}$, $PC_{i(j+1)}$, $PC_{i(j+2)}$, $PC_{i(j+3)}$, $PC_{i(j+4)}$, and $PC_{i(j+5)}$ are described. Because elements included in each of the pixel circuits $PC_{ij}$, $PC_{i(j+1)}$, $PC_{i(j+2)}$, $PC_{i(j+3)}$, $PC_{i(j+4)}$, and $PC_{i(j+5)}$ may be equally applicable to elements of the pixel circuit $PC_{ij}$, which is one of the pixel circuits $PC_{ij}$, $PC_{i(j+1)}$, $PC_{i(j+2)}$, $PC_{i(j+3)}$, $PC_{i(j+4)}$, and $PC_{i(j+5)}$, description is made based on the pixel circuit $PC_{ij}$.

The pixel circuit $PC_{ij}$ may include the driving thin-film transistor T1, the scan thin-film transistor T2, the compensation thin-film transistor T3, the gate initialization thin-film transistor T4, the first emission control thin-film transistor T5, the second emission control thin-film transistor T6, the anode initialization thin-film transistor T7, and the storage capacitor Cst.

In some embodiments, the driving thin-film transistor T1 includes a driving channel region C1, a driving source region S1, a driving drain region D1, and a driving gate electrode G1, the driving source region S1 and the driving drain region D1 being respectively located on two opposite sides of the driving channel region C1. The driving source region S1, the driving drain region D1, and the driving gate electrode G1 may respectively correspond to the source, the drain, and the gate of the driving thin-film transistor T1 of FIG. 4.

In some embodiments, the driving channel region C1 may be formed to be relatively longer than other channel regions C2 to C7. As an example, the driving channel region C1 may form a relatively long channel length inside of a narrow space by including a shape that is bent a plurality of times, such as the shape of the Greek letter omega or the letter "S". Because the driving channel region C1 is formed to be relatively long, a driving range of a gate voltage applied to a driving gate electrode G1 is widened and a grayscale of light emitted from the light-emitting element OLED (see FIG. 4) may be more elaborately or more precisely controlled, thus improving a display quality.

In some embodiments, the storage capacitor Cst may overlap the driving thin-film transistor T1. The storage capacitor Cst includes the bottom electrode CE1 and the top electrode CE2. The driving gate electrode G1 may serve as the bottom electrode CE1 of the storage capacitor as well as the gate of the driving thin-film transistor T1. Accordingly, it may be understood that the driving gate electrode G1 and the bottom electrode CE1 constitute one body.

In some embodiments, the top electrode CE2 may include an opening SOP. The opening SOP is formed by removing a portion of the top electrode CE2 and may have a closed shape. A node connection pattern NCP (see FIG. 7) may be connected to the bottom electrode CE1 through a fifth contact plug CP5 (see FIG. 7) arranged inside of the opening SOP. The top electrode CE2 may be connected to the power line PL through an eighth plug CP8 (see FIG. 7). The top electrode CE2 may extend in the first direction DR2 to transfer the first driving voltage ELVDD in the first direction DR1.

In some embodiments, the switching thin-film transistor T2 includes a switching channel region C2, a switching source region S2, a switching drain region D2, and a switching gate electrode G2, the switching source region S2 and the switching drain region D2 being located respectively on two opposite sides of the switching channel region C2. The switching source region S2, the switching drain region D2, and the switching gate electrode G2 respectively correspond to a source, a drain, and a gate of the switching thin-film transistor T2 of FIG. 4. The switching source region S2 may be connected to the data line DL_j through the data connection pattern DCP (see FIG. 7), a fourth contact plug CP4 (see FIG. 7), and an eleventh contact plug CP11.

In some embodiments, the compensation thin-film transistor T3 may include a first compensation thin-film transistor T3a and a second compensation thin-film transistor T3b that are connected to each other in series. The first compensation thin-film transistor T3a may include a first compensation channel region C3a, a first compensation source region S3a, a first compensation drain region D3a, and a first compensation gate electrode G3a, the first compensation source region S3a and the first compensation drain region D3a being located respectively on two opposite sides of the first compensation channel region C3a. The second compensation thin-film transistor T3b may include a second compensation channel region C3b, a second compensation source region S3b, a second compensation drain region D3b, and a second compensation gate electrode G3b, the second compensation source region S3b and the second compensation drain region D3b being located respectively on two opposite sides of the second compensation channel region C3b. The driving gate electrode G1 may be connected to the drain region D3a through the node connection pattern NCP, the fifth contact plug CP5, and a sixth contact plug CP6 (see FIG. 7).

In some embodiments, the gate initialization thin-film transistor T4 may include a first gate initialization thin-film transistor T4a and a second gate initialization thin-film transistor T4b that are connected to each other in series. The first gate initialization thin-film transistor T4a includes a first gate initialization channel region C4a, a first gate initialization source region S4a, a first gate initialization drain region D4a, and a first gate initialization gate electrode G4a, the first gate initialization source region S4a and the first gate initialization drain region D4a being located respectively on two opposite sides of the first gate initialization channel region C4a. The second gate initialization thin-film transistor T4b includes a second gate initialization channel region C4b, a second gate initialization source region S4b, a second gate initialization drain region D4b, and a second gate initialization gate electrode G4b, the second gate initialization source region S4b and the second gate initialization drain region D4b being located respectively on two opposite sides of the second gate initialization channel region C4b. The second gate initialization drain region D4b may be connected to the voltage line VL.

In some embodiments, the first emission control thin-film transistor T5 includes a first emission control channel region C5, a first emission control source region S5, a first emission control drain region D5, and a first emission control gate electrode G5, the first emission control source region S5 and the first emission control drain region D5 being located respectively on two opposite sides of the first emission control channel region C5. The first emission control source region S5, the first emission control drain region D5, and the first emission control gate electrode G5 respectively correspond to a source, a drain, and a gate of the first emission control thin-film transistor T5 of FIG. 4. The first emission control source region S5 may be connected to the power line PL through a seventh contact plug CP7 (see FIG. 7).

In some embodiments, the second emission control thin-film transistor T6 includes a second emission control channel region C6, a second emission control source region S6, a second emission control drain region D6, and a second emission control gate electrode G6, the second emission control source region S6 and the second emission control drain region D6 being located respectively on two opposite sides of the second emission control channel region C6. The second emission control source region S6, the second emission control drain region D6, and the second emission control gate electrode G6 respectively correspond to a source, a drain, and a gate of the second emission control thin-film transistor T6 of FIG. 4. The second emission control drain region D6 may be connected to the anode of the light-emitting element OLED through a first anode connection pattern ACP1 (see FIG. 7), a tenth contact plug CP10 (see FIG. 7), a second anode connection pattern ACP2, a thirteenth contact plug CP13, and a fourteenth contact plug CP14.

In some embodiments, the anode initialization thin-film transistor T7 includes an anode initialization channel region C7, an anode initialization source region S7, an anode initialization drain region D7, and an anode initialization gate electrode G7, the anode initialization source region S7 and the anode initialization drain region D7 being located respectively on two opposite sides of the anode initialization channel region C7. The anode initialization source region S7, the anode initialization drain region D7, and anode initialization gate electrode G7 respectively correspond to a source, a drain, and a gate of the anode initialization thin-film transistor T7 of FIG. 4. The anode initialization source region S7 may be connected to the anode of the light-emitting element OLED through a first anode connection pattern ACP1, the tenth plug CP10, the second anode connection pattern ACP2, the thirteenth contact plug CP13, and the fourteenth contact plug CP14. The anode initialization drain region D7 may be connected to the voltage line VL.

Referring to FIG. 6, a semiconductor layer Act, which is one of a plurality of layers of FIG. 5, may include a plurality of active regions $A_{ij}$, $A_{i(j+1)}$, $A_{i(j+2)}$, $A_{i(j+3)}$, $A_{i(j+4)}$, and $A_{i(j+5)}$, and the voltage line VL, wherein the plurality of active regions $A_{ij}$, $A_{i(j+1)}$, $A_{i(j+2)}$, $A_{i(j+3)}$, $A_{i(j+4)}$, and $A_{i(j+5)}$ are respectively included in the pixel circuits $PC_{ij}$, $PC_{i(j+1)}$, $PC_{i(j+2)}$, $PC_{i(j+3)}$, $PC_{i(j+4)}$, and $PC_{i(j+5)}$. The voltage line VL included in the semiconductor layer Act may be the horizontal voltage line VLh extending in the first direction DR1. The voltage line VL may be connected to the active regions $A_{ij}$, $A_{i(j+1)}$, $A_{i(j+2)}$, $A_{i(j+3)}$, $A_{i(j+4)}$, and $A_{i(j+5)}$.

In some embodiments, a first conductive layer CL1 (see FIG. 7) is arranged on the semiconductor layer Act. In this case, portions of the semiconductor layer Act that overlap the first conductive layer CL1 may respectively correspond to the channel regions C1 C2, C3, C4, C5, C6, and C7.

Referring to FIG. 7, the first conductive layer CL1 on the semiconductor layer Act may include a first scan line GWL1_i, first initialization gate lines GIL1_i and GIL1_i+1, an emission control line EML_i, a gate pattern GP, and the bottom electrode CE1. The second conductive layer CL2 on the first conductive layer CL1 may include a second scan line GWL2_i, second initialization gate lines GIL2_i and GIL2_i+1, the power line PL, the connection patterns NCP, VCP, DCP, and ACP1.

In some embodiments, portions of the semiconductor layer Act that overlap the first conductive layer CL1 may respectively correspond to gate electrodes G1, G2, G3, G4, G5, G6, and G7. As an example, the bottom electrode CE1 may include the driving gate electrode G1; the first scan line GWL1_i may include the switching gate electrode G2, the first compensation gate electrode G2a, and the second compensation gate electrode G3a; the first initialization gate lines GIL1_i and GIL1_i+1 may each include the first gate initialization gate electrode G4a and the second gate initialization gate electrode G4b; the emission control line EML_i may include the first emission control gate electrode G5 and the second emission control gate electrode G6; and the gate pattern GP may include the anode initialization gate electrode G7.

In some embodiments, the scan line GWL_i may include the first scan line GWL1_i and the second scan line GWL2_i. The first scan line GWL1_i may include a first extension portion EP1 extending in the first direction DR1 and a plurality of first branches BR1. Each of the first branches BR1 may extend in the second direction DR2 from the first extension portion EP1. The second scan line GWL2_i may extend in the first direction DR1. In a plan view, the second scan line GWL2_i may be spaced apart from the first extension portion EP1 of the first scan line GWL1_i in the second direction DR2.

In some embodiments, the first scan line GWL1_i may be connected to the second scan line GWL2_i through the first contact plugs CP1. As an example, as shown in FIG. 7, the first branches BR1 of the first scan line GWL1_i may be connected to the second scan line GWL2_i through the first contact plugs CP1. The second scan line GWL2_i may overlap at least a portion of the first branches BR1 of the first scan line GWL1_i extending in the second direction DR2 and may be connected to the first branches BR1 of the first scan line GWL1_i through the first contact plugs CP1.

Although it is shown in FIG. 7 that the first scan line GWL1_i includes the first branches BR1, the second scan line GWL2_i may include branches in other embodiments. In this case, the branches of the second scan line GWL2_i may be connected to the first scan line GWL1_i through contact plugs. The first scan line GWL1_i may overlap at least a portion of the branches of the second scan line GWL2_i. The first scan line GWL1_i may be connected to the branches of the second scan line GWL2_i through contact plugs.

In some embodiments, the number of pixels in an i-th row from among the plurality of pixels PX may be k, the plurality of pixels PX being between first contact plugs CP1 that are adjacent to each other in the first direction DR1 from among the plurality of first contact plugs CP1. In other words, the number of data lines DL_j, DL_j+1, DL_j+2, DL_j+3, DL_j+4, and DL_j+5 arranged between the first contact plugs CP1 is k, the first contact plugs CP1 being adjacent to each other in the first direction DR1 from among the plurality of first contact plugs CP1. Here, k is a natural number. FIGS. 5 and 7 show the case where k is 3 as an example.

In some embodiments, the initialization gate line GIL_i may include the first initialization gate line GIL1_i and the second initialization gate line GIL2_i. The first initialization gate line GIL1_i and the second initialization gate line GIL2_i may each extend in the first direction DR1.

The first initialization gate line GIL1_i may include a second extension portion EP2 extending in the first direction DR1, and a plurality of second branches BR2.

In some embodiments, each of the second branches BR2 may include a first portion BR2a, a second portion BR2b, a third portion BR2c, and a fourth portion BR2d. The first portion BR2a of the second branch BR2 may extend in the second direction DR2 from the second extension portion EP2, the second portion BR2b of the second branch BR2 may extend in the first direction DR1 from the first portion BR2a, and the third portion BR2c and the fourth portion BR2d of the second branch BR2 may each extend in the second direction DR2 from the second portion BR2b.

In some embodiments, at least one of the first portion BR2a, the second portion BR2b, the third portion BR2c, and the fourth portion BR2d of the second branch BR2 may be omitted. As an example, the fourth portion BR2d of a portion of the second branch BR2 that is shown in FIG. 7 may be omitted.

In some embodiments, the second initialization gate line GIL2_i may include a plurality of first portions P1 and a plurality of second portions P2. The first portions P1 of the second initialization gate line GIL2_i may each extend in the first direction DR1 in a plan view and may be spaced apart in the second direction DR2 from the first initialization gate line GIL1_i. The second portions P2 of the second initialization gate line GIL2_i may each extend in the first direction DR1 in a plan view and at least partially overlap the first initialization gate line GIL1_i. In some embodiments, the first portions P1 and the second portions P2 of the second initialization gate line GIL2_i may be alternatingly arranged in the first direction DR1.

In some embodiments, the first initialization gate line GIL1_i may be connected to the second initialization gate line GIL2_i through the plurality of second contact plugs CP2. The second initialization gate line GIL2_i may include third branches BR3 extending in the second direction DR2 from the first portions P1 of the second initialization gate line GIL2_i. The first initialization gate line GIL1_i may overlap at least a portion of the third branches BR3 each extending in the second direction DR2 and may be connected to the second initialization gate line GIL2_i through the second contact plugs CP2.

Although it is shown in FIG. 7 that the second initialization gate line GIL2_i includes the third branches BR3, the first initialization gate line GIL1_i may include branches extending in the second direction DR2 from the first initialization gate line GIL1_i according to other embodiments. The second initialization gate line GIL2_i may overlap at least a portion of the branches each extending in the second direction DR2 and may be connected to the first initialization gate line GIL1_i through the second contact plugs CP2.

In some embodiments, the number of pixels in an i-th row from among the plurality of pixels PX may be k, the plurality of pixels PX being between second contact plugs CP2 that are adjacent to each other in the first direction DR1 from among the plurality of second contact plugs CP1. In other words, the number of data lines DL_j, DL_j+1, DL_j+2, DL_j+3, DL_j+4, and DL_j+5 arranged between the second contact plugs CP2 is k, the second contact plugs CP2 being adjacent to each other in the first direction DR1 from among the plurality of second contact plugs CP2. FIGS. 5 and 7 show the case where k is 3 as an example.

In some embodiments, the plurality of gate patterns GP may be spaced apart from each other in the first direction DR1. In other words, the gate patterns GP may each have an island shape.

In some embodiments, the gate patterns GP may be connected to the plurality of third contact plugs CP3 through the second initialization gate line GIL2_i. The gate patterns GP may at least partially overlap the second initialization gate line GIL2_i. The gate patterns GP may at least partially overlap one of the first portions P1 of the second initialization gate line GIL2_i. The gate patterns GP may at least partially overlap one of the first portions P1 of the second initialization gate line GIL2_i and may be connected to the second initialization gate line GIL2_i through the third contact plugs CP3.

As a result, the gate patterns GP may receive an initialization signal through the second initialization gate line GIL2_i, and anode initialization gate electrodes G7 of each of the gate patterns GP may receive an initialization signal.

In some embodiments, the number of gate patterns GP that at least partially overlap one of the first portions P1 of the second initialization gate line GIL2_i may be k. FIGS. 5 and 7 show the case where k is 3 as an example.

In some embodiments, as shown in FIG. 7, the first initialization gate lines GIL1_i and GIL1_i+1 may overlap the second scan line GWL2_i.

Referring to FIG. 5 again, the first branches BR1 of the first scan line GWL1_i and the second branches BR2 of the first initialization gate line GIL1_i may surround one side and another side of each of the active regions $A_{ij}$, $A_{i(j+1)}$, $A_{i(j+2)}$, $A_{i(j+3)}$, $A_{i(j+4)}$, and $A_{i(j+5)}$ in a plan view.

As an example, as shown in FIG. 5, third portions BR2c of each of the second branches BR2 may be arranged on one side of each of the active regions $A_{ij}$, $A_{i(j+1)}$, $A_{i(j+2)}$, $A_{i(j+4)}$, and $A_{i(j+5)}$, and the first branch BR1 and fourth portions BR2d of the second branches BR2 may be arranged on another side of each of the active regions $A_{ij}$, $A_{i(j+1)}$, $A_{i(j+2)}$, $A_{i(j+3)}$, $A_{i(j+4)}$, and $A_{i(j+5)}$.

In this case, the first branches BR1 of the first scan line GWL1_i and the second branches BR2 of the first initialization gate line GIL1_i may shield the active regions $A_{ij}$, $A_{i(j+1)}$, $A_{i(j+2)}$, $A_{i(j+3)}$, $A_{i(j+4)}$, and $A_{i(j+5)}$ and a neighboring metal layer, thereby reducing signal coupling due to a parasitic capacitance between the active regions $A_{ij}$, $A_{i(j+2)}$, $A_{i(j+3)}$, $A_{i(j+4)}$, and $A_{i(j+5)}$ and the neighboring metal layer.

In some embodiments, the second branch BR2 of the first initialization gate line GIL1_i may be arranged between the data line DL_j and the node connection pattern NCP in a plan view. The third portion BR2c of the second branch BR2 may be arranged between the data line DL_j and the node connection pattern NCP in a plan view. In this case, the third portion BR2c of the second branch BR2 may shield the data line DL_j and the node connection pattern NCP to reduce or prevent an undesired (e.g., unnecessary) capacitance from being formed between the data line DL_j and the node connection pattern NCP. More particularly, because the first initialization gate line GIL1_i is maintained constant at a turn-off voltage while a data voltage is stored in pixels in an i-th row, and the pixels in the i-th row emit light according to the data voltage, data voltages applied to the data line DL_j may be reduced from influencing the active regions $A_{ij}$, $A_{i(j+1)}$, $A_{i(j+3)}$, $A_{i(j+4)}$, and $A_{i(j+5)}$.

FIG. 8 is a cross-sectional view of the pixel circuit of FIG. 5, taken along the lines I-I' and II-II'.

According to some embodiments, FIG. 8 shows the driving thin-film transistor T1, the second emission control thin-film transistor T6, the first scan line GWL1_i, and the second scan line GWL2_$i$ of FIG. 5. In some embodiments, some members shown in FIG. 8 may be omitted.

Here, a multi-layer stacked on the display apparatus is described in more detail with reference to FIG. 8.

In some embodiments, a substrate 200 may include a glass material, a ceramic material, a metal material, or a flexible or bendable material. In the case where the substrate 200 is flexible or bendable, the substrate 200 may include a polymer resin such as, for example, polyethersulfone, polyacrylate, polyetherimide, polyethylene naphthalate, polyethylene terephthalate, polyphenylene sulfide, polyarylate, polyimide, polycarbonate, and/or cellulose acetate propionate.

In some embodiments, the substrate 200 may have a single-layered structure or a multi-layered structure including the above materials and may further include an inorganic layer in the case the substrate 200 has a multi-layered structure. In some embodiments, the substrate 200 may have a structure in the form of an organic material/an inorganic material/an organic material.

In some embodiments, a barrier layer may be further arranged between the substrate 200 and a buffer layer 211. The barrier layer may prevent or reduce the penetration of impurities from below the substrate 200, etc. into the semiconductor layer Act (see FIG. 6) including the active region $A_{ij}$. The barrier layer may include an inorganic material such as an oxide or a nitride, an organic material, or an organic/inorganic composite material and may include a single-layered structure or a multi-layered structure including an inorganic material and an organic material.

In some embodiments, the semiconductor layer Act may be arranged on the buffer layer 211. The semiconductor layer Act may include amorphous silicon or polycrystalline silicon.

In other embodiments, the semiconductor layer Act may include an oxide semiconductor material. The semiconductor layer Act may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn).

As an example, the semiconductor layer Act may be an InSnZnO (ITZO) semiconductor layer or an InGaZnO (IGZO) semiconductor layer. Because the oxide semiconductor has a wide band gap (of about 3.1 eV), a high carrier mobility, and a low leakage current, even though a driving time is relatively long, a voltage drop is not large. Accordingly, a brightness change corresponding to a voltage drop is not large while the display apparatus is driven at low frequencies.

In some embodiments, the active region $A_{ij}$ may include channel regions C1 and C6, source regions S1 and S6 and drain regions D1 and D6, respectively arranged on two opposite sides of the channel regions C1 and C6. The active region $A_{ij}$ may include a single layer or a multi-layer.

In some embodiments, a first gate insulating layer 213 and a second gate insulating layer 215 may be stacked over the substrate 200 to cover the semiconductor layer Act. The first gate insulating layer 213 and the second gate insulating layer 215 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

In some embodiments, the gate electrodes G1 and G6 and the first conductive layer CL1 (see FIG. 7) including the first scan line GWL1_$i$ may be arranged on the first gate insulating layer 213. The first conductive layer CL1 may include a conductive material including molybdenum (Mo), aluminum (Al), copper (Cu), and titanium (Ti), and may include a single layer or a multi-layer including the above materials. As an example, the first conductive layer CL1 may have a multi-layered structure of Ti/Al/Ti.

In some embodiments, the storage capacitor Cst may include the bottom electrode CE1 and the top electrode CE2 and overlap the driving thin-film transistor T1 as shown in FIG. 8. As an example, the driving gate electrode G1 of the driving thin-film transistor T1 may serve as the bottom electrode CE1 of the storage capacitor Cst. In other embodiments, the storage capacitor Cst may not overlap the driving thin-film transistor T1, but instead may be provided separately.

In some embodiments, the top electrode CE2 of the storage capacitor Cst may overlap the bottom electrode CE1 with the second gate insulating layer 215 therebetween and constitute a capacitance. In this case, the second gate insulating layer 215 may serve as a dielectric layer of the storage capacitor Cst. The top electrode CE2 of the storage capacitor Cst may include a conductive material including, for example, molybdenum (Mo), aluminum (Al), copper (Cu), and/or titanium (Ti), and may include a single layer or a multi-layer including the above materials. As an example, the top electrode CE2 of the storage capacitor Cst may have a multi-layered structure of Ti/Al/Ti.

In some embodiments, an interlayer insulating layer 217 may be provided on the second gate insulating layer 215 to cover the top electrode CE2 of the storage capacitor Cst. The interlayer insulating layer 217 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

In some embodiments, a second conductive layer CL2 (see FIG. 7) may be arranged on the interlayer insulating layer 217, the second conductive layer CL2 including the first anode connection pattern ACP1 and the second scan line GWL2_$i$. The second conductive layer CL2 may include a conductive material including, for example, molybdenum (Mo), aluminum (Al), copper (Cu), and/or titanium (Ti) and may include a single layer or a multi-layer including the above materials. As an example, the second conductive layer CL2 may have a multi-layered structure of Ti/Al/Ti.

In some embodiments, the first anode connection pattern ACP1 and the second scan line GWL2_$i$ may be respectively connected to the active region $A_{ij}$ and the first scan line GWL1_$i$ through contact holes defined in the insulating layers.

As an example, the first anode connection pattern ACP1 may be connected to the second emission control thin-film transistor T6 through a contact hole CNT defined by the first gate insulating layer 213, the second gate insulating layer 215, and the interlayer insulating layer 217. A portion of the first anode connection pattern ACP1 may be buried in the contact hole CNT, and the portion of the first anode connection pattern ACP1 that is buried in the contact hole CNT may be denoted by the tenth contact plug CP10. In other words, the first anode connection pattern ACP1 and the tenth contact plug CP10 may be provided as one body.

In some embodiments, the second scan line GWL2_$i$ may be connected to the first scan line GWL1_$i$ through the first contact hole CNT1 defined by the second gate insulating layer 215 and the interlayer insulating layer 217. A portion of the second scan line GWL2_$i$ may be buried in the first contact hole CNT1, and the portion of the second scan line GWL2_$i$ that is buried in the first contact hole CNT1 may be denoted by the first contact plug CP1. In other words, the second scan line GWL2_$i$ and the first contact plug CP1 may be provided as one body.

In some embodiments, the gate driver 120 shown in FIG. 1 may output a scan signal GW_$i$ to the second scan line GWL2_$i$. In this case, a linear resistance of the second scan line GWL2_$i$ may be less than a linear resistance of the first scan line GWL1_$i$. In this case, because a scan signal GW_$i$ is transferred to the first scan line GWL1_$i$ through the second scan line GWL2_$i$ having a relatively small linear resistance, pixels PX in the same row may receive a scan signal GW_$i$ with a reduced or relatively shorter signal delay.

In some embodiments, the second conductive layer CL2 may be covered by an inorganic protective layer. The inorganic protective layer may include a single layer or a multi-layer including silicon nitride ($SiN_x$) and silicon oxide ($SiO_x$). The inorganic protective layer may be introduced to cover and protect some wirings arranged on the interlayer insulating layer 217.

In some embodiments, a planarization layer 219 may be arranged on the interlayer insulating layer 217. A light-emitting element 300 may be arranged on the planarization layer 219.

The planarization layer 219 may include a single layer or a multi-layer including an organic material, and may provide a flat upper surface. The planarization layer 219 may include a general-purpose polymer such as, for example, benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

In some embodiments, the planarization layer 219 may include a first planarization layer 219$a$ and a second planarization layer 219$b$.

In some embodiments, the second anode connection pattern ACP2 may be arranged on the first planarization layer 219$a$. The second anode connection pattern ACP2 may be connected to the first anode connection pattern ACP1 through a contact hole CNT' defined in the first planarization layer 219$a$. A portion of the second anode connection pattern ACP2 may be buried in the contact hole CNT', and the portion of the second anode connection pattern ACP2 that is buried in the contact hole CNT' may be denoted by the thirteenth contact plug CP13. In other words, the second anode connection pattern ACP2 and the thirteenth contact plug CP13 may be provided as one body.

In some embodiments, a pixel electrode 310 may be arranged on the second planarization layer 219$b$. The pixel electrode 310 may be connected to the second anode connection pattern ACP2 through a contact hole CNT" defined in the second planarization layer 219$b$. A portion of the pixel electrode 310 may be buried in the contact hole CNT", and the portion of the pixel electrode 310 that is buried in the contact hole CNT" may be denoted by the fourteenth contact plug CP14. In other words, the pixel electrode 310 and the fourteenth contact plug CP14 may be provided as one body.

As described above, the pixel electrode 310 may be connected to the second emission control thin-film transistor T6 through the first anode connection pattern ACP1, the tenth contact plug CP10, the second anode connection pattern ACP2, the thirteenth contact plug CP13, and the fourteenth contact plug CP14.

In some embodiments, the light-emitting element 300 may be arranged on the planarization layer 219. The light-emitting element 300 may include the pixel electrode 310, an intermediate layer 320, and an opposite electrode 330, wherein the intermediate layer 320 includes an organic emission layer.

In some embodiments, the pixel electrode 310 may be a transparent or a semi-transparent electrode or a reflective electrode. In some embodiments, the pixel electrode 310 may include a reflective layer and a transparent or semi-transparent electrode layer on the reflective layer. The reflective layer may include, for example, silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent electrode layer may include, for example, at least one of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 310 may include ITO/Ag/ITO.

In some embodiments, a pixel-defining layer 221 may be arranged on the planarization layer 219. In addition, the pixel-defining layer 221 may reduce or prevent the likelihood of an arc, etc. from occurring at the edges of the pixel electrode 310 by increasing a distance between the edges of the pixel electrode 310 and the opposite electrode 330 over the pixel electrode 310.

In some embodiments, the pixel-defining layer 221 may include at least one organic insulating material including, for example, polyimide, polyamide, an acrylic resin, benzocyclobutene, and/or a phenolic resin and may be formed through spin coating, etc.

In some embodiments, the intermediate layer 320 may be arranged inside an opening defined by the pixel-defining layer 221. The intermediate layer 320 may include an organic emission layer. The organic emission layer may include an organic material including a fluorescent or phosphorous material emitting red, green, blue, and/or white light. The organic emission layer may include a low molecular weight organic material or a polymer organic material. A functional layer such as a hole transport layer (HTL), a hole injection layer (HIL), an electron transport layer (ETL), or an electron injection layer (EIL) may be selectively arranged under or on the organic emission layer, respectively.

In some embodiments, the intermediate layer 320 may be arranged to correspond to each of a plurality of pixel electrodes 310. However, the present disclosure is not limited thereto. The intermediate layer 320 may include a layer which is one body over the plurality of pixel electrodes 310. However, various modifications may be made.

In some embodiments, the opposite electrode 330 may be a transparent electrode or a reflective electrode. In some embodiments, the opposite electrode 330 may be a transparent or semi-transparent electrode and may include a thin metal layer of a relatively small work function including, for example, lithium (Li), Ca, lithium fluoride (LiF)/Ca, LiF/Al, Al, Ag, Mg, and a compound thereof. In addition, a transparent conductive oxide (TCO) layer may be further arranged on the thin metal layer, wherein the TCO layer includes, for example, ITO, IZO, ZnO, or $In_2O_3$. The opposite electrode 330 may be arranged over the display portion and arranged on the intermediate layer 320 and the pixel-defining layer 221. The opposite electrode 330 may be formed as one body over the plurality of light-emitting elements 300 to correspond to the plurality of pixel electrodes 310.

In some embodiments, the light-emitting element 300 may be covered by an encapsulation layer. The encapsulation layer may include at least one organic encapsulation layer and at least one inorganic encapsulation layer.

In some embodiments, the inorganic encapsulation layer may include, for example, at least one inorganic material from among aluminum oxide, titanium oxide, tantalum oxide, hafnium oxide, zinc oxide, silicon oxide, silicon nitride, and silicon oxynitride. A first inorganic encapsulation layer and a second inorganic encapsulation layer may include a single layer or a multi-layer including the above materials. The organic encapsulation layer may include a polymer-based material. The polymer-based material may include, for example, polyethylene terephthalate, an acryl-based resin such as poly acrylic acid, an epoxy-based resin, polyimide, and/or polyethylene. In some embodiments, the organic encapsulation layer may include an acrylate polymer.

Figure 9:
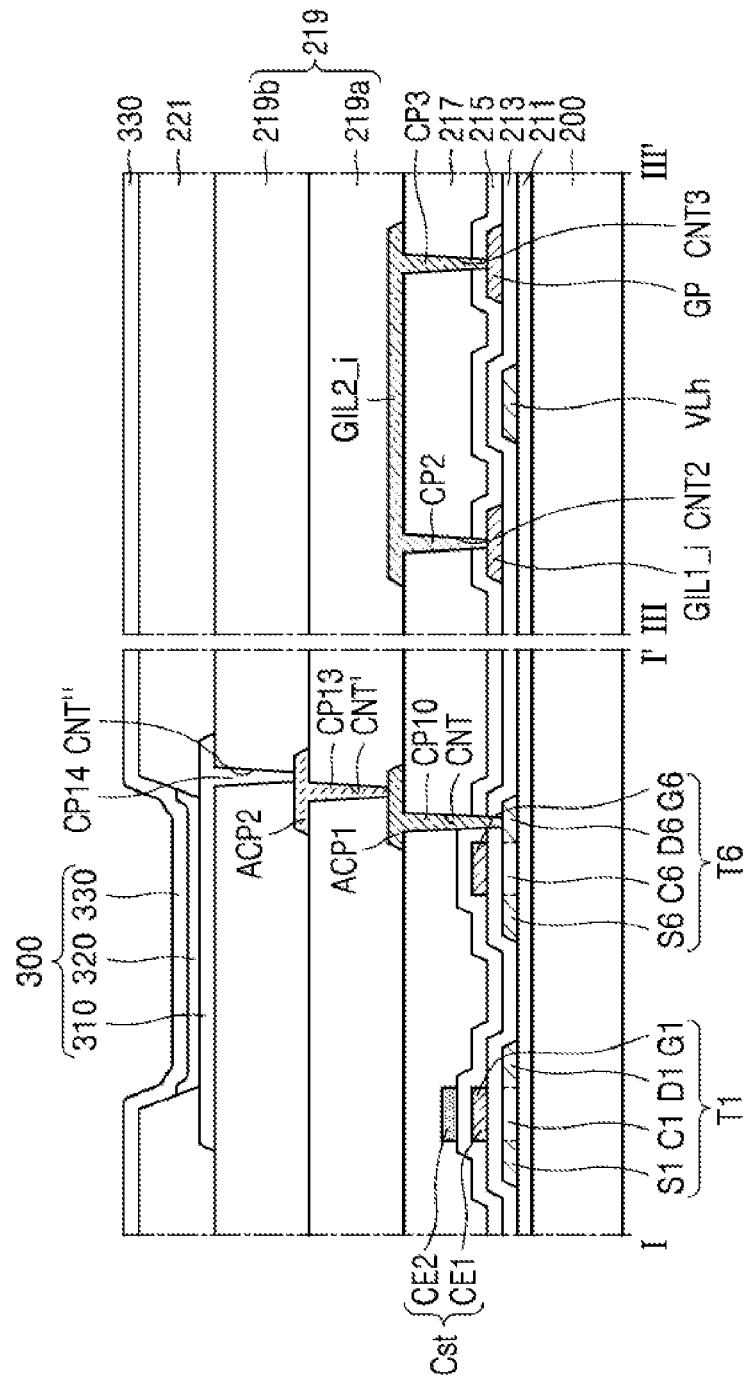
FIG. 9 is a cross-sectional view of the pixel circuit of FIG. 5, taken along the lines I-I' and III-III'.

FIG. 9 is a cross-sectional view of the pixel circuit of FIG. 5, taken along the lines I-I' and III-III'. In FIG. 9, the same reference numerals as those of FIG. 8 denote the same members, and thus, repeated descriptions thereof are omitted.

FIG. 9 shows the driving thin-film transistor T1, the second emission control thin-film transistor T6, the first initialization gate line GIL1_$i$, the second initialization gate line GIL2_$i$, the gate pattern GP, and the horizontal voltage line VLh of FIG. 5. In some embodiments, some of the members shown in FIG. 9 may be omitted.

In some embodiments, the horizontal voltage line VLh may be arranged on the buffer layer 211. As shown in FIGS. 5 and 6, the horizontal voltage line VLh may be included in the semiconductor layer Act.

In some embodiments, the first initialization gate line GIL1_$i$ and the gate pattern GP may be arranged on the first gate insulating layer 213. The first initialization gate line GIL1_$i$ and the gate pattern GP may be included in the first conductive layer CL1 together with the gate electrodes G1 and G6.

In some embodiments, the second initialization gate line GIL2_$i$ may be arranged on the interlayer insulating layer 217. The second initialization gate line GIL2_$i$ may be included in the second conductive layer CL2 together with the first anode connection pattern ACP1.

In some embodiments, the second initialization gate line GIL2_$i$ may be connected to the first initialization gate line GIL1_$i$ through the second contact hole CNT2 defined by the second gate insulating layer 215 and the interlayer insulating layer 217. A portion of the second initialization gate line GIL2_$i$ may be buried in the second contact hole CNT2, and the portion of the second initialization gate line GIL2_$i$ that is buried in the second contact hole CNT2 may be denoted by the second contact plug CP2. In other words, the second initialization gate line GIL2_$i$ and the second contact plug CP2 may be provided as one body.

In some embodiments, the second initialization gate line GIL2_$i$ may be connected to the gate pattern GP through a third contact hole CNT3 defined in the second gate insulating layer 215 and the interlayer insulating layer 217. A portion of the second initialization gate line GIL2_$i$ may be buried in the third contact hole CNT3, and the portion of the second initialization gate line GIL2_$i$ that is buried in the third contact hole CNT3 may be denoted by the third contact plug CP3. In other words, the second initialization gate line GIL2_$i$ and the third contact plug CP3 may be provided as one body.

In some embodiments, the gate driver 120 shown in FIG. 1 may output a first initialization signal GI_i to the second initialization gate line GIL2_$i$. In this case, a linear resistance of the second initialization gate line GIL2_$i$ may be less than a linear resistance of the first initialization gate line GIL1_$i$. In this case, because a first initialization signal GI_i is transferred to the first initialization gate line GIL1_$i$ and the gate pattern GP through the second initialization gate line GIL2_$i$ having a small linear resistance, pixels PX in the same row may receive a first initialization signal GI_i with a reduced or relatively less signal delay.

Although only the display apparatus has been described, the present disclosure is not limited thereto. As an example, a method for manufacturing the display apparatus also falls within the scope of the present disclosure.

According to some embodiments, a display apparatus is described with a reduced resistance of wirings configured to transfer an electric signal to pixels. However, the scope of the present disclosure is not limited by this effect.

It should be understood that the embodiments described herein should be considered in a descriptive sense only and not for purposes of limitation. Descriptions of aspects within the embodiments should typically be considered applicable for other similar aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
   a plurality of pixels arranged on a substrate;
   a first scan line arranged on the substrate and comprising a first extension portion and a plurality of first branches, the first extension portion extending in a first direction in a plan view and connected to pixels in a same row from among the plurality of pixels, and the plurality of first branches extending in a second direction from the first extension portion;
   a second scan line arranged on the substrate, extending in the first direction in a plan view, and being spaced apart from the first extension portion in the second direction, the second scan line overlapping at least a portion of the plurality of first branches; and
   a plurality of first contact plugs connecting the plurality of first branches to the second scan line.

2. The display apparatus of claim 1, wherein a number of pixels arranged in a same row from among the plurality of pixels is k,
   wherein the plurality of pixels are arranged between first contact plugs that are adjacent to each other in the first direction from among the plurality of first contact plugs, and
   wherein k is a natural number.

3. The display apparatus of claim 1, further comprising:
   a first initialization gate line arranged on the substrate, extending in the first direction in a plan view, and connected to pixels in a same row from among the plurality of pixels;
   a second initialization gate line arranged on the substrate, extending in the first direction in a plan view, and comprising a plurality of first portions and a plurality of second portions, the plurality of first portions being spaced apart in the second direction from the first initialization gate line, and the plurality of second portions partially overlapping at least a portion of the first initialization gate line; and a plurality of second contact plugs connecting the first initialization gate line to the second initialization gate line.

4. The display apparatus of claim 3, wherein the plurality of first portions and the plurality of second portions of the second initialization gate line are alternatingly arranged in the first direction.

5. The display apparatus of claim 3, wherein the second initialization gate line comprises a plurality of second branches each extending in the second direction from the plurality of first portions, and
wherein each of the plurality of second contact plugs connects the first initialization gate line to the plurality of second branches.

6. The display apparatus of claim 3, wherein a number of pixels arranged in a same row from among the plurality of pixels is k,
wherein the plurality of pixels are arranged between second contact plugs that are adjacent to each other in the first direction from among the plurality of second contact plugs, and
wherein k is a natural number.

7. The display apparatus of claim 3, wherein the first initialization gate line comprises a second extension portion and a plurality of third branches, the second extension portion extending in the first direction in a plan view, and
wherein each of the plurality of third branches comprises a first portion, a second portion, and a third portion, the first portion extending in the second direction from the second extension portion, the second portion extending in the first direction from the first portion, and the third portion extending in the second direction from the second portion.

8. The display apparatus of claim 7, wherein each of the plurality of pixels comprises:
a light-emitting element;
a driving thin-film transistor configured to control a current flowing through the light-emitting element according to a gate-source voltage;
a compensation thin-film transistor configured to connect a drain of the driving thin-film transistor to a gate of the driving thin-film transistor in response to a scan signal; and
a node connection pattern connecting the gate of the driving thin-film transistor to a drain of the compensation thin-film transistor,
wherein the display apparatus further comprises a data line arranged on the substrate, extending in the second direction in a plan view, and connected to pixels in a same column from among the plurality of pixels, and
wherein the third portion of the first initialization gate line is arranged between the data line and the node connection pattern in a plan view.

9. The display apparatus of claim 3, further comprising a plurality of gate patterns spaced apart from each other in the first direction, and at least partially overlapping one of the plurality of first portions of the second initialization gate line.

10. The display apparatus of claim 9, wherein a number of the plurality of gate patterns at least partially overlapping one of the plurality of first portions of the second initialization gate line is 3.

11. The display apparatus of claim 9, further comprising:
a first conductive layer arranged on the substrate and comprising the first scan line, the first initialization gate line, and the plurality of gate patterns; and
a second conductive layer arranged on the first conductive layer and comprising the second scan line and the second initialization gate line.

12. The display apparatus of claim 1, wherein the second scan line is arranged on the first scan line and overlaps at least a portion of the plurality of first branches.

13. The display apparatus of claim 12, wherein the second scan line and the plurality of first contact plugs are provided as one body.

14. The display apparatus of claim 1, further comprising a semiconductor layer arranged between the substrate and the first scan line, the semiconductor layer comprising a plurality of active regions and a voltage line,
wherein the plurality of pixels comprises a respective active region of the plurality of active regions, and
wherein the voltage line is connected to the plurality of active regions.

15. A display apparatus comprising:
a plurality of pixels arranged on a substrate;
a first gate line arranged on the substrate, extending in a first direction in a plan view, and connected to pixels in a same row from among the plurality of pixels;
a second gate line arranged on the substrate, extending in the first direction in a plan view, and comprising a plurality of first portions and a plurality of second portions, the plurality of first portions being spaced apart in a second direction from the first gate line, and the plurality of second portions overlapping at least a portion of the first gate line; and
a plurality of contact plugs connecting the first gate line to the second gate line.

16. The display apparatus of claim 15, wherein the plurality of first portions and the plurality of second portions of the second gate line are alternatingly arranged in the first direction.

17. The display apparatus of claim 15, wherein the second gate line comprises a plurality of first branches each extending in the second direction from the plurality of first portions, and
wherein each of the plurality of contact plugs connects the first gate line to the plurality of first branches.

18. The display apparatus of claim 15, wherein a number of pixels arranged in a same row from among the plurality of pixels is k,
wherein the plurality of pixels are arranged between contact plugs that are adjacent to each other in the first direction from among the plurality of contact plugs, and
wherein k is a natural number.

19. The display apparatus of claim 15, wherein the first gate line comprises an extension portion and a plurality of second branches, the extension portion extending in the first direction in a plan view, and
wherein each of the plurality of second branches comprises a first portion, a second portion, and a third portion, the first portion extending in the second direction from the extension portion, the second portion extending in the first direction from the first portion, and the third portion extending in the second direction from the second portion.

20. The display apparatus of claim 15, further comprising a plurality of gate patterns being spaced apart from each other in the first direction and at least partially overlapping one of the plurality of first portions of the second gate line.

* * * * *